(12) United States Patent
Cheng et al.

(10) Patent No.: US 8,772,874 B2
(45) Date of Patent: Jul. 8, 2014

(54) MOSFET INCLUDING ASYMMETRIC SOURCE AND DRAIN REGIONS

(75) Inventors: Kangguo Cheng, Schenectady, NY (US); Balasubramanian S. Haran, Watervliet, NY (US); Shom Ponoth, Clifton Park, NY (US); Theodorus E. Standaert, Clifton Park, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 89 days.

(21) Appl. No.: 13/216,554

(22) Filed: Aug. 24, 2011

(65) Prior Publication Data

US 2013/0049115 A1 Feb. 28, 2013

(51) Int. Cl.
*H01L 27/01* (2006.01)
*H01L 27/12* (2006.01)
*H01L 31/0392* (2006.01)

(52) U.S. Cl.
USPC ............. 257/347; 257/E21.409; 257/E29.255

(58) Field of Classification Search
USPC ........... 438/286; 257/286, E21.401, E29.255, 257/347
See application file for complete search history.

(56) References Cited

U.S. PATENT DOCUMENTS

| | | | |
|---|---|---|---|
| 5,650,340 | A | 7/1997 | Burr et al. |
| 6,833,307 | B1 | 12/2004 | Wristers et al. |
| 7,208,397 | B2 | 4/2007 | Feudel et al. |
| 7,504,327 | B2 | 3/2009 | Yamazaki et al. |
| 7,714,397 | B2 * | 5/2010 | Hareland et al. ............. 257/401 |
| 2006/0040450 | A1 | 2/2006 | Hsu |
| 2008/0093640 | A1 | 4/2008 | Babich et al. |
| 2010/0081244 | A1 | 4/2010 | Papageorgiou et al. |
| 2011/0108918 | A1 | 5/2011 | Yin et al. |

OTHER PUBLICATIONS

Shibahara, K. et al., "Gate-Extension Overlap Control by Sb Tilt Implantation" IEICE Transactions on Electronics (May 1, 2007) pp. 973-977, vol. E-90-C, No. 5.
Miyashita, T. et al., "Feasibility Study of Solid-Phase Epitaxial Regrowth (SPER) as an Ultra-Shallow Junction (USJ) Technology for High-Performance CMOS Devices" IEEE, International Workshop on Junction Technology, IWJT '06 (Aug. 14, 2006) pp. 92-95.
Lu, G.Q. et al., "Pressure-Enhanced Crystallization Kinetics of Amorphous Si and Ge: Implications for Point-Defect Mechanisms" Journal of Applied Physics (Nov. 15, 1991) pp. 5323-5345, vol. 70, No. 10.

* cited by examiner

*Primary Examiner* — David S Blum
(74) *Attorney, Agent, or Firm* — Scully, Scott, Murphy & Presser, P.C.; Joseph Petrokaitis, Esq.

(57) ABSTRACT

At least one drain-side surfaces of a field effect transistor (FET) structure, which can be a structure for a planar FET or a fin FET, is structurally damaged by an angled ion implantation of inert or electrically active dopants, while at least one source-side surface of the transistor is protected from implantation by a gate stack and a gate spacer. Epitaxial growth of a semiconductor material is retarded on the at least one structurally damaged drain-side surface, while epitaxial growth proceeds without retardation on the at least one source-side surface. A raised epitaxial source region has a greater thickness than a raised epitaxial drain region, thereby providing an asymmetric FET having lesser source-side external resistance than drain-side external resistance, and having lesser drain-side overlap capacitance than source-side overlap capacitance.

17 Claims, 14 Drawing Sheets

MOSFET INCLUDING ASYMMETRIC SOURCE AND DRAIN REGIONS

BACKGROUND

The present disclosure relates to semiconductor structures, and more particularly to planar and fin field effect transistor (FET) structures having asymmetric source and drain regions, and methods of manufacturing the same.

The source-side external resistance and the drain-side external resistance of a field effect transistor impact the performance of the field effect transistor in different ways. For example, external resistance due to a source region or a source extension region has a significant impact both on the linear-regime drain current (Idlin) and the saturation drain current (Idsat) of a field effect transistor. In contrast, external resistance due to a drain region or a drain extension region has a significant impact on the linear-regime drain current of the field effect transistor, but does not impact the saturation drain current of the field effect transistor.

Further, reducing the overlap capacitance between a gate electrode and a drain extension region of a field effect transistor improves high frequency performance of the field effect transistor due to Miller effect. However, reducing the overlap capacitance between the gate electrode and a source extension region of the field effect transistor does not provide a corresponding benefit.

Thus, an asymmetric overlap of the gate electrode with a source extension region and with a drain extension region can provide various benefits in the performance of a field effect transistor.

BRIEF SUMMARY

Angled ion implantation that structurally damages a single crystalline surface of a semiconductor surface can retard the epitaxial growth of a semiconductor material thereupon. At least one drain-side surfaces of a field effect transistor (FET) structure, which can be a structure for a planar FET or a fin FET, is structurally damaged by an angled ion implantation of inert or electrically active dopants, while at least one source-side surface of the transistor is protected from implantation by a gate stack and a gate spacer. Epitaxial growth of a semiconductor material is retarded on the at least one structurally damaged drain-side surface, while epitaxial growth proceeds without retardation on the at least one source-side surface. A raised epitaxial source region has a greater thickness than a raised epitaxial drain region, thereby providing an asymmetric FET having lesser source-side external resistance than drain-side external resistance, and having lesser drain-side overlap capacitance than source-side overlap capacitance.

According to an aspect of the present disclosure, a semiconductor structure including a field effect transistor is provided. The field effect transistor includes: a gate stack including a gate dielectric and a gate electrode and located on a substrate; a raised source region having a top surface at a first distance from a bottom surface of the gate dielectric; and a raised drain region having a top surface at a second distance from the bottom surface of the gate dielectric, wherein the first distance is greater than the second distance.

According to another aspect of the present disclosure, a method of forming a semiconductor structure is provided. The method includes: forming a gate stack including a gate dielectric and a gate electrode on a semiconductor portion in a substrate; forming a structurally damaged region on a drain side of the semiconductor portion by angled ion implantation of a dopant, wherein a source side surface of the semiconductor material portion is shielded from ions during the ion implantation; and depositing a raised source region on the source side surface and a raised drain region on the structurally damaged region by selective epitaxial growth of a semiconductor material, wherein a thicker semiconductor material is deposited in the raised source region than in the raised drain region due to retardation of epitaxial growth on the structurally damaged region relative to the source side surface during the deposition.

BRIEF DESCRIPTION OF SEVERAL VIEWS OF THE DRAWINGS

In the present disclosure, drawings that are labeled with the same numeric label represent the same stage of a manufacturing process. Drawings that are labeled with the suffix "A" are top-down views. Drawings that are labeled with the suffix "B" are vertical cross-sectional views along a vertical plane B-B' in the top-down view labeled with the same numeric label and the suffix "A."

FIG. 7C is a side view of the second exemplary semiconductor structure in a direction perpendicular to the plane B-B' in FIG. 7A.

DETAILED DESCRIPTION

Figure 1A:
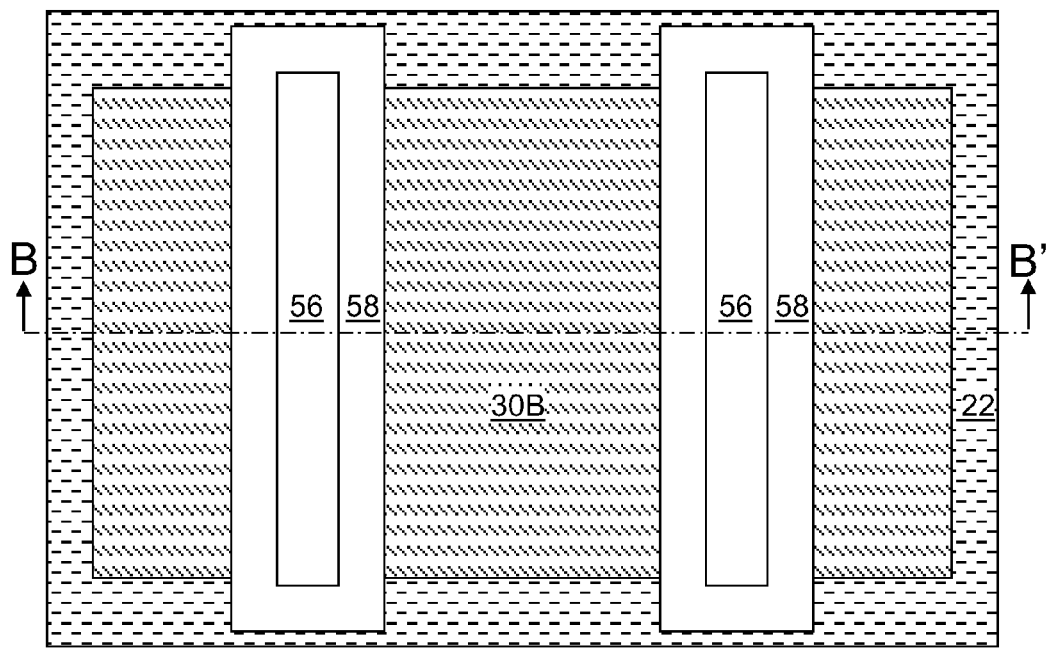
FIGS. 1A and 1B are views of a first exemplary semiconductor structure after formation of gate structures on a substrate including a planar semiconductor region according to a first embodiment of the present invention.

As stated above, the present disclosure relates to planar and fin field effect transistor (FET) structures having asymmetric source and drain regions, and methods of manufacturing the same, which are now described in detail with accompanying figures. It is noted that like and corresponding elements are referred to by like reference numerals. Further, references to a singular element apply to a plurality of elements identified by the same reference numerals, and vice versa.

Figure 1B:
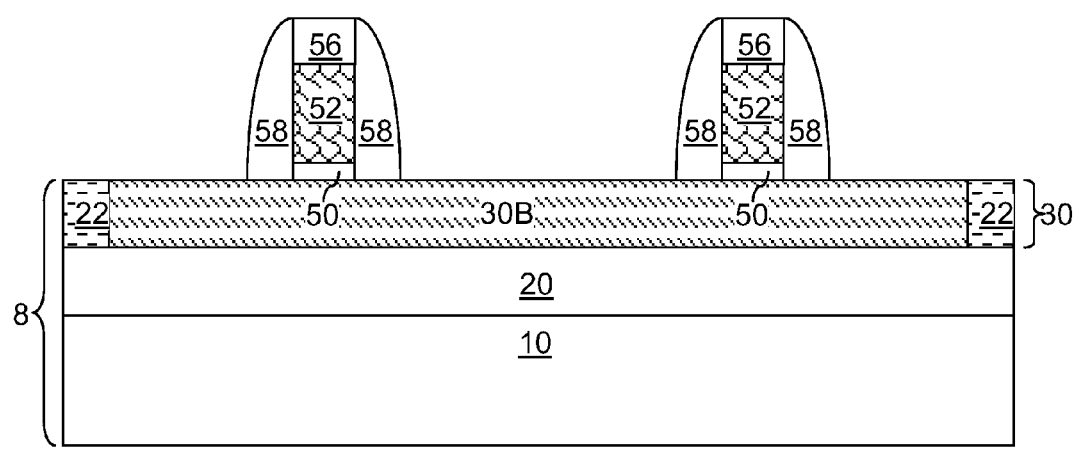

Referring to FIGS. 1A and 1B, a first exemplary semiconductor structure according to a first embodiment of the present invention includes a semiconductor substrate 8 and gate structures formed thereupon. The semiconductor substrate 8 can be a semiconductor-on-insulator (SOI) substrate including a stack, from bottom to top, of a handle substrate 10, a buried insulator layer 20, and a top semiconductor layer 30. Alternately, the semiconductor substrate 8 can be a bulk substrate including a semiconductor material therein.

The semiconductor substrate 8 includes a semiconductor material region having an exposed top semiconductor surface. If the semiconductor substrate 8 is an SOI substrate, the semiconductor material region can be located in the top semiconductor layer 30. If the semiconductor substrate 8 is a bulk semiconductor substrate (not shown), the semiconductor material portion can be a top portion of the bulk semiconductor substrate. Shallow trench isolation structures 22 including a dielectric material can be formed in a layer including the semiconductor material portion. Sidewalls of the semiconductor material portion laterally contact the shallow trench isolation structures 22. A plurality of semiconductor material portions laterally spaced by, and electrically isolated by, the shallow trench isolation structures 22 can be formed in the semiconductor substrate 8.

The semiconductor material portion includes a single crystalline semiconductor material, which can be single crystalline silicon, single crystalline germanium, a single crystalline silicon-germanium alloy, a single crystalline silicon-carbon alloy, a single crystalline silicon-germanium-carbon alloy, a single crystalline compound semiconductor material, a stack thereof, and/or a combination thereof.

Gate stacks can be formed on the semiconductor substrate 8 by deposition and patterning of gate stack layers. The patterning of the gate stack layers can be effected by application of a photoresist (not shown), lithographic patterning of the photoresist, transfer of the pattern in the photoresist into the gate stack layers, and removal of the photoresist, for example, by ashing. Each patterned gate stack includes at least a gate dielectric 50 and a gate electrode 52, and can optionally include a gate cap dielectric 56. In one embodiment, the materials of the patterned gate stack (50, 52, 56) can be disposable materials that are subsequently removed, and are replaced with another gate stack including a permanent gate dielectric and a permanent gate electrode.

The gate dielectric 50 can include silicon oxide, silicon nitride, silicon oxynitride, or a combination thereof. Alternately or additionally, the gate dielectric 50 can include a high dielectric constant (high-k) dielectric material having a dielectric constant greater than 8.0. Exemplary high-k dielectric materials include dielectric metal oxides, dielectric metal nitrides, and dielectric oxide-nitride compounds.

The gate electrode 52 includes at least one conductive material. Conductive materials that can be employed for the gate electrode 52 includes, but are not limited to, doped semiconductor materials and metallic materials.

The gate cap dielectric 56, if employed, includes a dielectric material. Dielectric materials that can be employed for the gate cap dielectric 56 includes silicon oxide, silicon nitride, silicon oxynitride, dielectric metal oxides, dielectric metal nitrides, and combinations thereof.

In one embodiment, a semiconductor material portion 30B within the top semiconductor layer 30 can include an intrinsic semiconductor material, i.e., a semiconductor material that is substantially free of electrical dopants.

In another embodiment, the semiconductor material portion 30B within the top semiconductor layer 30 can include a doped semiconductor material. The conductivity type of the semiconductor material portions 30B provided at the top surface of the semiconductor substrate 8 is herein referred to as a first conductivity type. The first conductivity type can be p-type or n-type.

A gate spacer 58 including a dielectric material can be formed around each gate stack (50, 52, 56). The gate spacer 58 can be formed, for example, by deposition of a conformal dielectric material layer and selective removal of horizontal portions of the deposited conformal dielectric material layer. The remaining vertical portions of the deposited conformal dielectric material layer constitute the gate spacer 58. Dielectric materials that can be employed for the gate spacers 58 include silicon oxide, silicon nitride, silicon oxynitride, and combinations thereof.

Figure 2A:
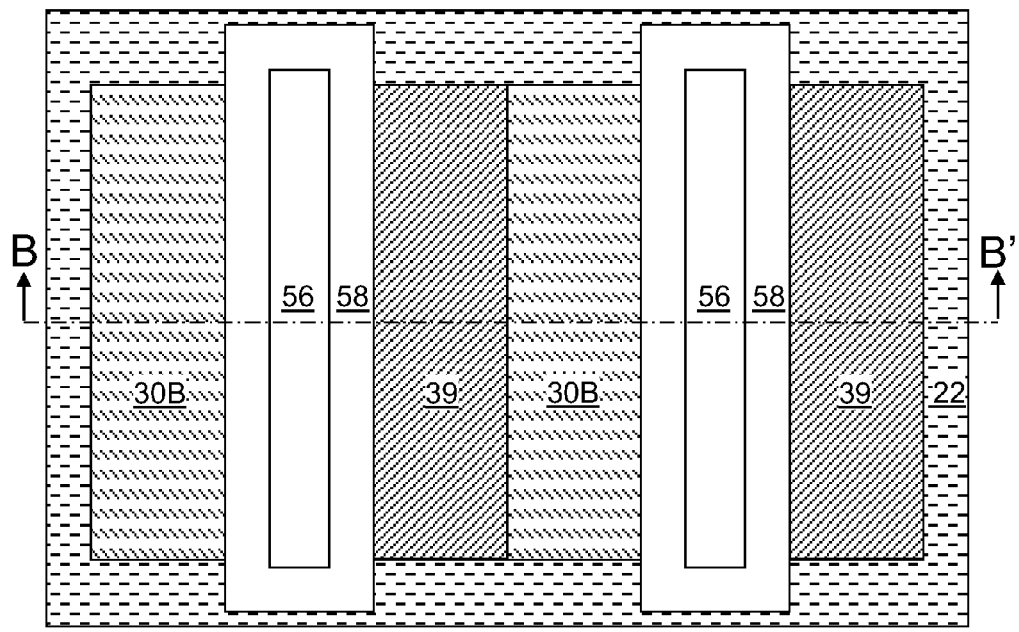
FIGS. 2A and 2B are views of the first exemplary semiconductor structure during angled ion implantation of a dopant to form a structurally damaged region according to the first embodiment of the present disclosure.
Figure 2B:
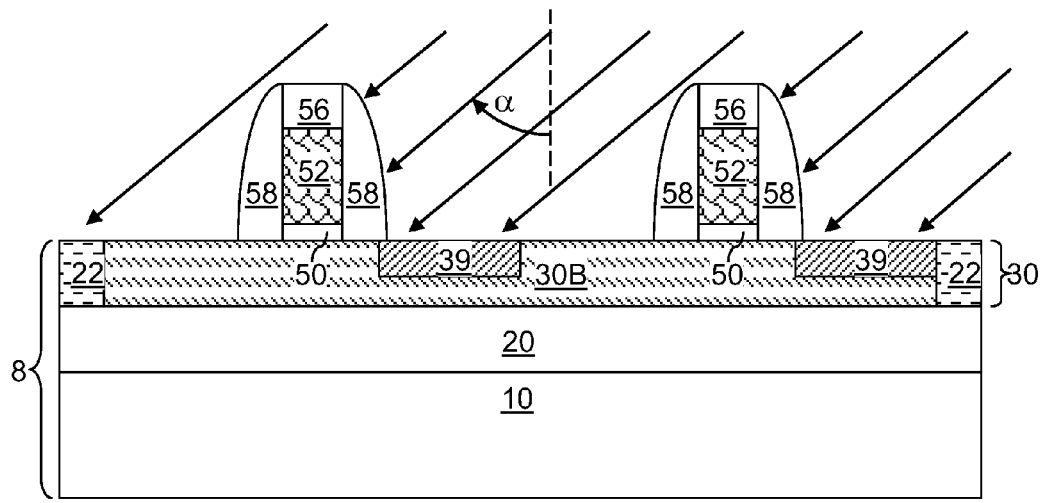

Referring to FIGS. 2A and 2B, angled ion implantation is performed into a first subset of surface portions of the semiconductor material portion, while a second subset of surface portions of the semiconductor material portion are not implanted by the ions. As measured in B-B' plane, the ion implantation is performed at an angle α relative to the surface normal of the top surface of the semiconductor substrate 8. The angle α can be from 5 degrees to 60 degrees, although lesser and greater angles can also be employed.

Because the gate stacks (50, 52, 56) and the gate spacers 58 block the path of the ion beam during the ion implantation, a surface portion of the semiconductor material portion at one side, which is herein referred to as a drain side, of each gate stack (50, 52, 56) is implanted with the ions, while another surface portion of the semiconductor material portion at the other side, which is herein referred to as a source side, of each gate stack (50, 52, 56) or directly below each gate stack (50, 52, 56) is not implanted with the ions. Thus, a structurally damaged region 39, which includes an imperfectly-single crystalline semiconductor material, i.e., a semiconductor material that has imperfect epitaxial alignment throughout, is formed by conversion of a surface portion of the semiconductor material portion 30B. The structurally damaged region 39 is not amorphous, not polycrystalline, and not completely epitaxial, but only partially epitaxial due to dislocations of a significant portion of atoms from their epitaxial atomic sites. In one embodiment, at least 1% of the atoms in the structurally damaged region 39 are displaced from the epitaxial crystal sites, i.e., from the ideal sites for a perfectly epitaxial crystal.

A single crystalline semiconductor material underlies each structurally damaged region 39. In one embodiment, the structurally damaged region 39 has a thickness that is less than the thickness of a top semiconductor layer 30 in an SOI substrate. The structurally damaged region 39 may extend below a peripheral region of one side of a gate spacer 58 on one side, and a location laterally spaced away from another gate stack (50, 52, 56) and the gate spacer 58 therearound because of the shielding effect that the other gate stack (50, 52, 56) provides to the semiconductor material portion. The shielded side relative to a gate stack (50, 52, 56) is the source side, and the unshielded side relative to the gate stack (50, 52, 56) is the drain side. A source region of the field effect transistor is subsequently formed on the source side, and a drain region of the field effect transistor is subsequently formed on the drain side. A source side surface of the semiconductor material portion is shielded from ions during the ion implantation, and a drain side surface of the semiconductor material portion is not shielded from ions during the ion implantation.

The ion implantation step implants ions into the structurally damaged regions 39. The ions remain in the structurally damaged regions 39, and alter the composition of the structurally damaged regions 39. As such, the ions incorporated into the structurally damaged regions 39 are referred to as "dopants." As used herein, a "dopant" refers to any element that is different from the underlying intrinsic semiconductor composition of a semiconductor material. Thus, a dopant can be an electrical dopant that provides a p-type doping or an n-type doping, or a non-electrical dopant that is electrically neutral.

The implanted dopant can be at least one Group IVA element, which can be the same as, or can be different from, the composition of the semiconductor material in the semiconductor material region as originally provided. In one embodiment, the implanted dopant is at least one Group IVA element that is different from the composition of the semiconductor material in the semiconductor material region as originally provided. For example, the original semiconductor material in the semiconductor material region can be a single crystalline silicon-germanium alloy, and the implanted dopant can be silicon or germanium or carbon. If the original semiconductor material in the semiconductor material region is epitaxial silicon, the implanted dopant can be germanium or carbon. If the original semiconductor material in the semiconductor material region is epitaxial germanium, the implanted dopant can be silicon or carbon. Further, if the original semiconductor material in the semiconductor material region is an epitaxial compound semiconductor material, the implanted dopant can be silicon or germanium or carbon.

In another embodiment, the implanted dopant can include at least one electrical dopant that is selected from Group IIIA elements and Group VA elements. For example, the original semiconductor material in the semiconductor material region is an elemental semiconductor (i.e., Si, Ge, C) or an alloy thereof, the implanted dopant can include B, Al, Ga, In, Tl, P, As, Sb, or a combination thereof. Further, if the original semiconductor material in the semiconductor material region is a compound semiconductor material, the implanted dopant can be selected such that the composition of the implanted dopant is different from the composition of the original compound semiconductor material in the semiconductor material region. For example, if the original compound semiconductor material includes $Ga_xAs_{1-x}$ in which x is from 0.45 to 0.55, the implanted dopant can be Ga, As, or a combination of Ga and As such that their aggregate composition $Ga_yAs_{1-y}$ has a value for y that is different from the value for x. The value for y can be greater than 0 and less than 1.

In yet another embodiment, the implanted dopant can include at least one noble gas, which includes He, Ne, Ar, Kr, and Xe.

Further, any combination of the at least one Group IVA element, at least one electrical dopant selected from Group IIIA elements and Group VA elements, and at least one noble gas can be employed to implant dopants into the structurally damaged regions 39.

The energy of the ion implantation is selected such that the depth of the structurally damaged region 39 does not exceed the thickness of the top semiconductor layer 30 in the case of an SOI substrate. The dose of the ion implantation is selected such that sufficient structural damage is made to the crystal structure in the semiconductor material of the structurally damaged regions 39 so that the rate epitaxial growth is retarded on the surface of the structurally damaged region 39 in a subsequent epitaxy step. A structure in which at least 1% of atoms are displaced from an ideal atomic location can cause a substantial retardation in a subsequent epitaxial deposition of a semiconductor material thereupon, and the effectiveness of retardation of growth increases with the increase in the percentage of atoms that are displaced from their ideal crystallographic locations.

Figure 3A:
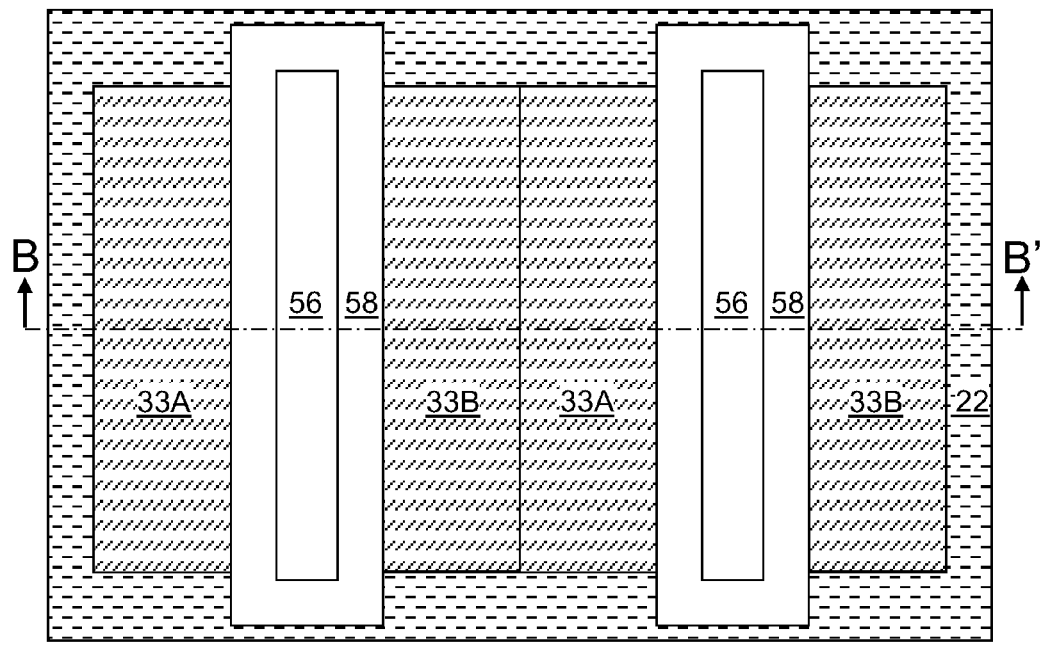
FIGS. 3A and 3B are views of the first exemplary semiconductor structure after formation of a source-side raised epitaxial semiconductor region and a drain-side raised epitaxial semiconductor region according to the first embodiment of the present disclosure.
Figure 3B:
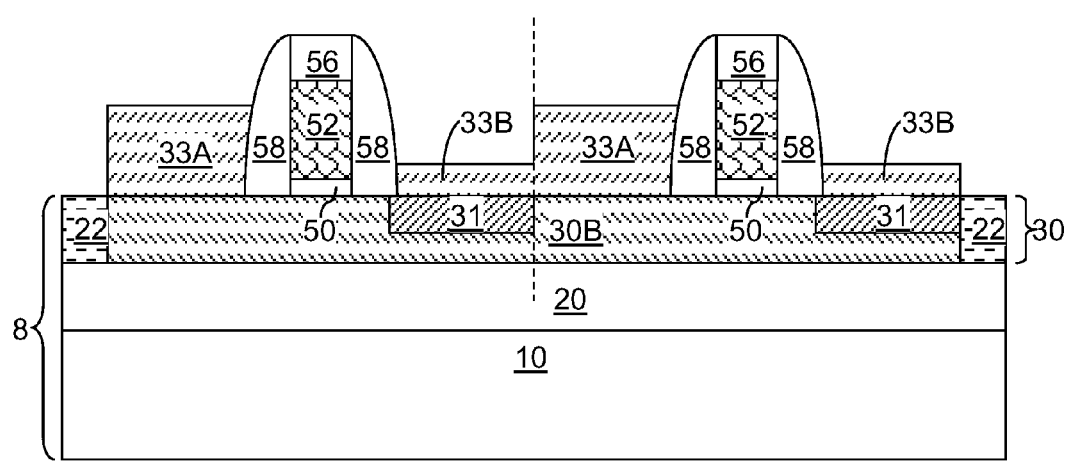

Referring to FIGS. 3A and 3B, selective epitaxy is performed to deposit a semiconductor material on the exposed semiconductor surfaces of the structurally damaged regions 39 and the semiconductor material portion 30B. The selective epitaxy is a deposition process in which a reactant gas including a precursor for a semiconductor material and an etchant are concurrently or alternately flowed into a process chamber in which a structure including at least one semiconductor surface and at least one dielectric surface is placed. Because deposition of a semiconductor material on a dielectric surface requires nucleation, a semiconductor material is deposited only on semiconductor surfaces, but is not deposited on dielectric surfaces.

The deposition rate of a semiconductor material is also dependent on the crystallinity of underlying semiconductor surfaces. Specifically, the deposition rate of the semiconductor material is the greatest on a perfectly epitaxial surface, and decreases with an increase in defect density on an imperfectly epitaxial surface, and decreases further on a polycrystalline semiconductor surface, and is the least on an amorphous semiconductor surface. Because the structurally damaged regions 39 include surface defects that impede the mobility of adatoms from the reactant, an epitaxial semiconductor material portion deposited on a structurally damaged region 39 has a lesser thickness than another epitaxial semiconductor material portion deposited directly on the semiconductor material portion 30B.

Because the selective epitaxy is performed at an elevated temperature that is sufficient to provide surface diffusion for the semiconductor material that is deposited, the underlying semiconductor material in the structurally damaged region 39 is subject to bulk diffusion. Thus, the selective epitaxy process operates as an anneal process that gradually cures the structural defects in the structurally damaged regions 39, thereby converting the structurally damaged regions 39 into buried epitaxial semiconductor material regions 31. During the selective epitaxy process, a drain-side raised epitaxial semiconductor region 33B is formed directly on the structurally damaged region 39. By the end of the selective epitaxy process, the drain-side raised epitaxial semiconductor regions 33B are present directly on the buried epitaxial semiconductor material regions 31. Further, a source-side raised epitaxial semiconductor regions 33A is formed directly on the exposed surface of each semiconductor material portion 30B. The source-side raised epitaxial semiconductor regions 33A have a greater thickness than the drain-side raised epitaxial semiconductor regions 33B.

The semiconductor material of the source-side raised epitaxial semiconductor regions 33A is the same as the semiconductor material of the drain-side raised epitaxial semiconductor regions 33B. The semiconductor material of the source-side raised epitaxial semiconductor regions 33A and the drain-side raised epitaxial semiconductor regions 33B can be the same as, or can be different from the semiconductor material of the semiconductor material portion 30B. The semiconductor material of the source-side raised epitaxial semiconductor regions 33A and the drain-side raised epitaxial semiconductor regions 33B can be an elemental semiconductor material, an alloy of at least two elemental semiconductor materials, a compound semiconductor material, or a stack thereof.

In one embodiment, the selective epitaxy process may deposit an intrinsic, i.e., undoped, semiconductor material. In this case, the drain-side raised epitaxial semiconductor regions 33B and the source-side raised epitaxial semiconductor region 33A include an intrinsic epitaxial semiconductor material. A thicker semiconductor material is deposited in the source-side raised epitaxial semiconductor region 33A than in the drain-side raised epitaxial semiconductor region 33B due to retardation of epitaxial growth on the structurally damaged region 39 relative to the epitaxial growth on the source side surface, i.e., the exposed surface of the semiconductor material portion 30B on the source side, during the deposition of the intrinsic semiconductor material by selective epitaxy. The thicker epitaxially deposited material in the source-side raised epitaxial semiconductor region 33A can provide more electrical dopants therein at the time of deposition. Therefore, more electrical dopants can diffuse out during a subsequent anneal process to provide a greater overlap between a doped region of a source and the gate dielectric 50 than between a doped region of a drain and the gate dielectric 50.

In another embodiment, the selective epitaxy process may provide in-situ doping of the deposited semiconductor material with electrical dopants. The in-situ doped deposited semiconductor material can be deposited on an intrinsic semiconductor material or a doped semiconductor material of the semiconductor material portion 30B. If the semiconductor material portion 30B has a doping of the first conductivity type, the in-situ doped deposited semiconductor material has a doping of the opposite conductivity type, which is herein referred to as a second conductivity type. In this case, the drain-side raised epitaxial semiconductor regions 33B is a raised drain region, and the source-side raised epitaxial semiconductor region 33A is a raised source region. Further, a buried epitaxial semiconductor material region 31 is a buried drain region.

Figure 4A:
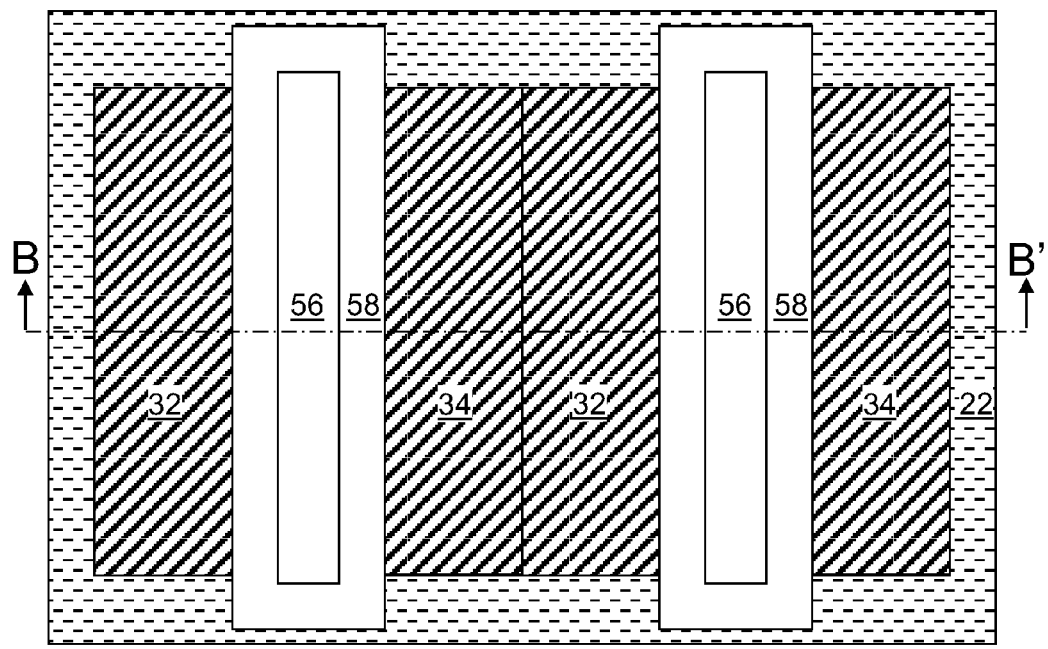
FIGS. 4A and 4B are views of the first exemplary semiconductor structure after formation of an epitaxial raised source region and an epitaxial raised drain according to the first embodiment of the present disclosure.
Figure 4B:
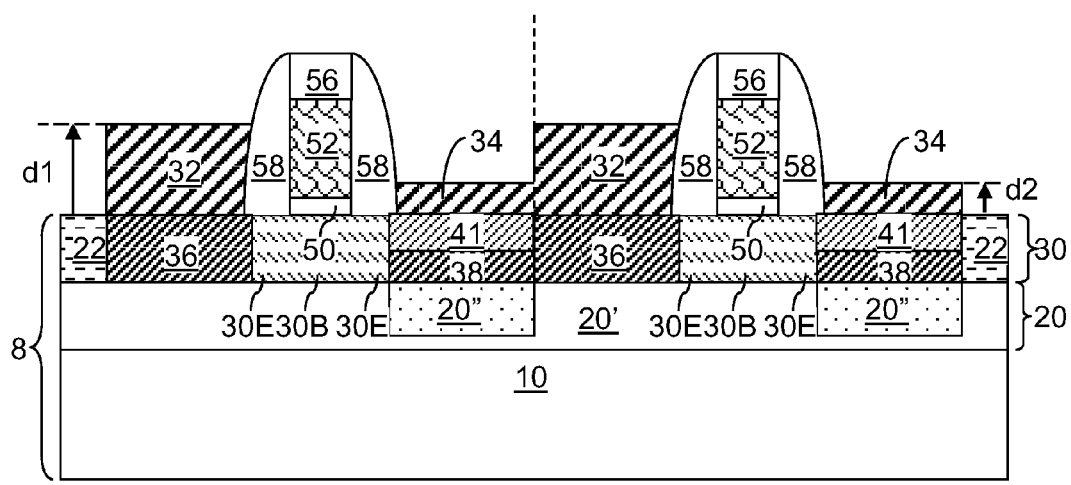

Referring to FIGS. 4A and 4B, electrical dopants of the second conductivity type can be implanted into the drain-side raised epitaxial semiconductor regions 33B and the source-side raised epitaxial semiconductor regions 33A, for example, by ion implantation. If the drain-side raised epitaxial semiconductor regions 33B and the source-side raised epitaxial semiconductor region 33A include an intrinsic epitaxial semiconductor material, electrical dopants of the second conductivity type are implanted into the drain-side raised epitaxial semiconductor regions 33B and the source-side raised epitaxial semiconductor region 33A. The drain-side raised epitaxial semiconductor regions 33B are doped with dopants of the second conductivity type to become raised drain regions 34. The buried epitaxial semiconductor material region 31 becomes an upper buried drain region 41, which includes all of the materials in the buried epitaxial semiconductor material region 31 and the additional electrical dopants of the second conductivity type added by the ion implantation. The source-side raised epitaxial semiconductor regions 33A are doped with dopants of the second conductivity type to become raised source regions 32. An implanted portion of the semiconductor material portion 30P underneath the source-side raised epitaxial semiconductor regions 33A is a buried source region 36. An implanted portion of the semiconductor material portion 30P underneath the upper buried drain region 41 is a lower buried drain region 38.

The raised drain regions 34 and the raised source regions 32 have the same material composition. The buried source region 36 and the lower buried drain region 38 have the same material composition, which can be the same as, or different from, the material composition of the raised drain regions 34 and the raised source regions 32. The semiconductor composition, i.e., the composition of the semiconductor material excluding any electrical dopants, of the buried source region 36 and the lower buried drain region 38 can be the same as, or can be different from, the semiconductor composition of the raised drain regions 34 and the raised source regions 32, provided that the lattice constant and the lattice structure of the semiconductor material of the raised drain regions 34 and the raised source regions 32 are compatible with epitaxial semiconductor deposition process directly on the surface of the semiconductor material of the buried source region 36 and the lower buried drain region 38.

If the drain-side raised epitaxial semiconductor regions 33B and the source-side raised epitaxial semiconductor region 33A include an in-situ doped semiconductor material, implantation of dopants of the second conductivity type is optional. If dopants of the second conductivity type are implanted into the drain-side raised epitaxial semiconductor regions 33B and the source-side raised epitaxial semiconductor region 33A, the structure of FIGS. 4A and 4B can result. If the processing steps of FIGS. 4A and 4B are omitted, the structure of FIGS. 3A and 3B remains.

Each stack of the buried source region 36 and the raised source region 32 constitutes a source region (36, 32), which functions as a source of a field effect transistor. Each stack of a lower buried drain region 38, an upper buried drain region 41, and a raised drain region 34 constitutes a drain region (38, 41, 34), which functions as a drain of the field effect transistor. The raised source region 32 has a top surface at a first distance d1 from the bottom surface of a gate dielectric 50, and the raised drain region 34 has a top surface at a second distance d2 from the bottom surface of the gate dielectric 50, and the first distance d1 is greater than the second distance d2 by at least 1 nm. In one embodiment, the first distance d1 is greater than the second distance d2 by at least 5 nm. The thickness of the raised drain region 34 can be from 1 nm to 30 nm, although lesser and greater thicknesses can also be employed.

In one embodiment, the raised source regions 32 and raised drain regions 34 can have a same composition throughout. The same composition can include a semiconductor material and at least one electrical dopant of the second conductivity type at a uniform dopant concentration.

The upper buried drain regions 41 have another composition that includes the at least one electrical dopant at the dopant concentration in the raised source regions 32 and the raised drain regions 34 and an additional dopant at an additional dopant concentration. As discussed above, the additional dopant can include at least one Group IVA element, at least one electrical dopant, at least one noble gas, or a combination thereof. The lower buried drain regions 38 and the buried source regions 32 have yet another composition that differs from the composition of the upper buried drain regions 41 by the absence of the additional dopant. A stack of an upper buried drain region 41 and a lower buried drain region 38 collectively constitute a buried drain region (38, 41).

The buried drain regions (38, 41) and the buried source regions 36 have topmost surfaces that are coplanar with the bottom surface of a gate dielectric 50. Each buried source region 36 is located below a raised source region 32, and each buried drain region (38, 41) is located below a raised drain region 34.

In one embodiment, the semiconductor substrate 8 is an SOI substrate, and the depth of ion implantation of the electrical dopants of the second conductivity type can be adjusted so that the electrical dopants of the second conductivity type are not implanted to portions of the buried insulator layer 20 underlying the buried source regions 36, while the electrical dopants of the second conductivity type are implanted into portions of the buried insulator layer 20 underlying the buried drain regions (38, 41). In this case, a doped buried insulator portion 20" can be formed underneath the buried drain regions (38, 41). The buried insulator layer 20 includes an undoped buried insulator portion 20' and doped buried insulator portions 20".

While the illustrated structure of FIGS. 4A and 4B illustrates embodiments in which the electrical dopants of the second conductivity type are implanted into the semiconductor material portion 30B, embodiments can also be employed in which the depth of ion implantation is controlled such that the electrical dopants are not implanted into the semiconductor material portion 30B. In this case, the electrical dopants of the second conductivity type can be implanted into the drain-side raised epitaxial semiconductor regions 33B and an upper portion of the source-side raised epitaxial semiconductor region 33A and optionally into the buried epitaxial semiconductor material region 31.

Figure 5A:
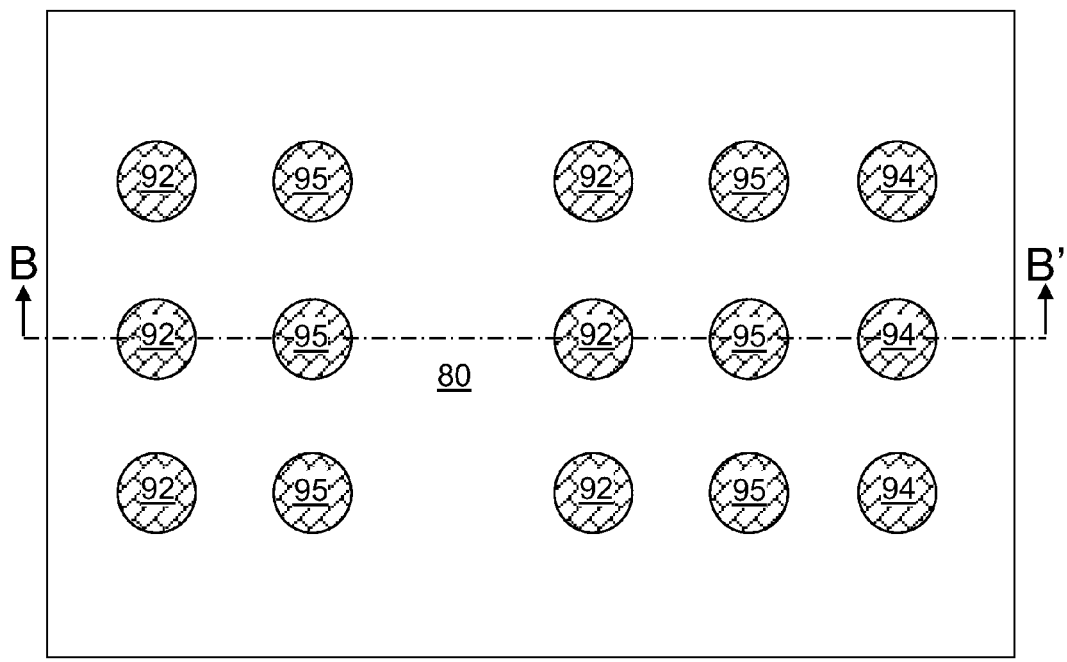
FIGS. 5A and 5B are views of the first exemplary semiconductor structure after formation of a contact-level dielectric layer and contact via structures therein according to the first embodiment of the present disclosure.
Figure 5B:
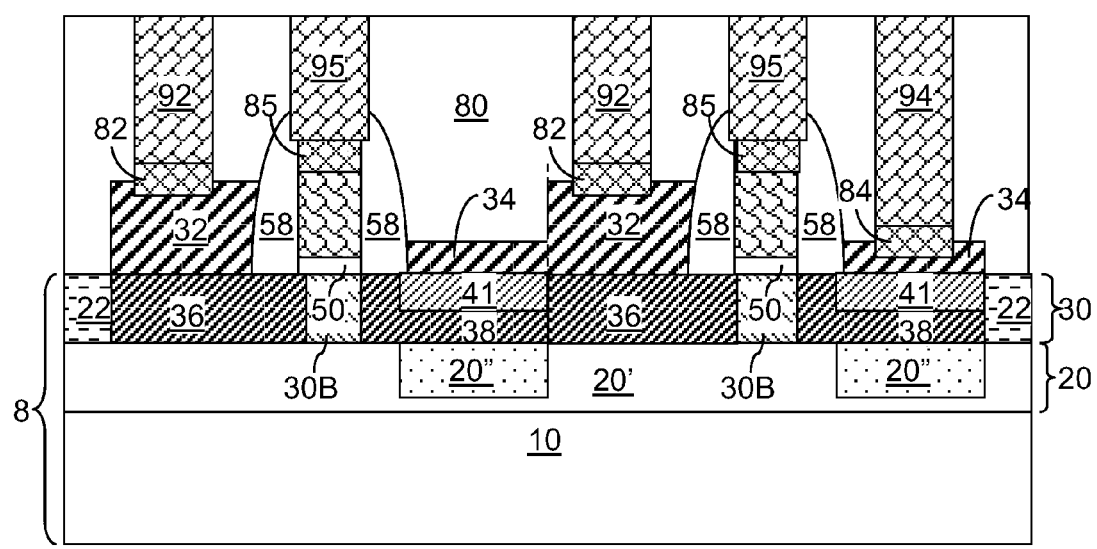

Referring to FIGS. 5A and 5B, a contact-level dielectric layer 80 and various contact via structures are formed. The contact-level dielectric layer 80 can include any material that can be employed as a dielectric material in metal interconnect structures. For example, the contact-level dielectric layer 80 can include doped or undoped silicate glass, silicon nitride, organosilicate glass, or a combination thereof. The contact via structures can include at least one source-side contact via structure 92, at least one drain-side contact via structure 94, and at least one gate-side contact via structure 95. Optionally, various metal semiconductor alloy regions can be formed by reacting a metal and an underlying semiconductor material. The various metal semiconductor alloy regions can include, for example, at least one source-side metal semiconductor alloy region 82, at least one drain-side metal semiconductor alloy region 84, and/or at least one gate-side metal semiconductor alloy region 85.

Figure 6A:
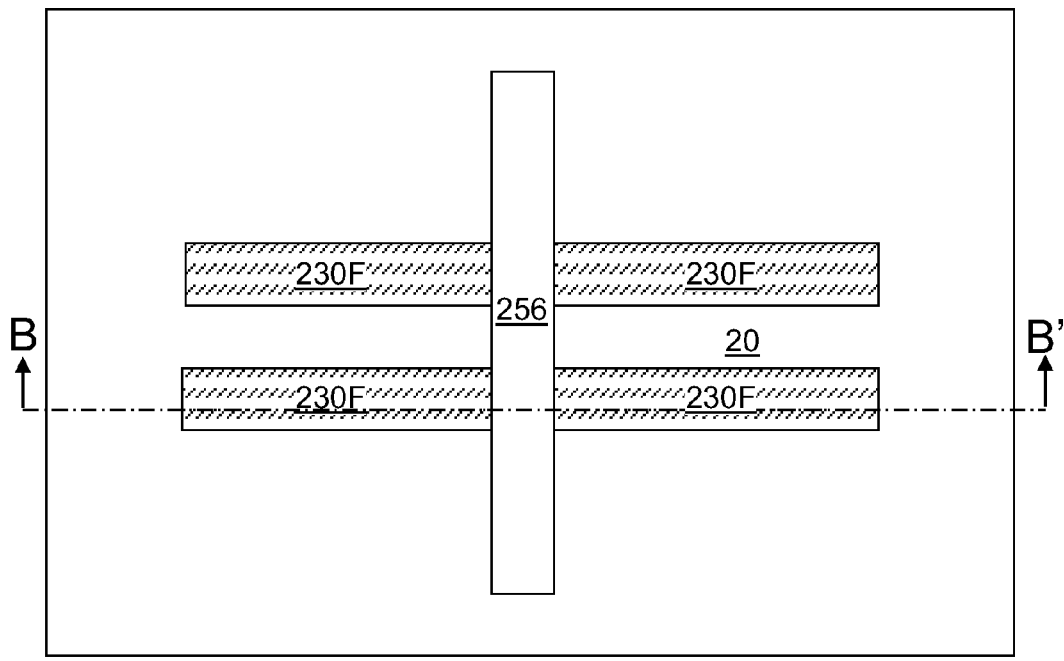
FIGS. 6A and 6B are views of a second exemplary semiconductor structure after formation of semiconductor fins, a gate dielectric, and a gate electrode according to a second embodiment of the present disclosure.
Figure 6B:
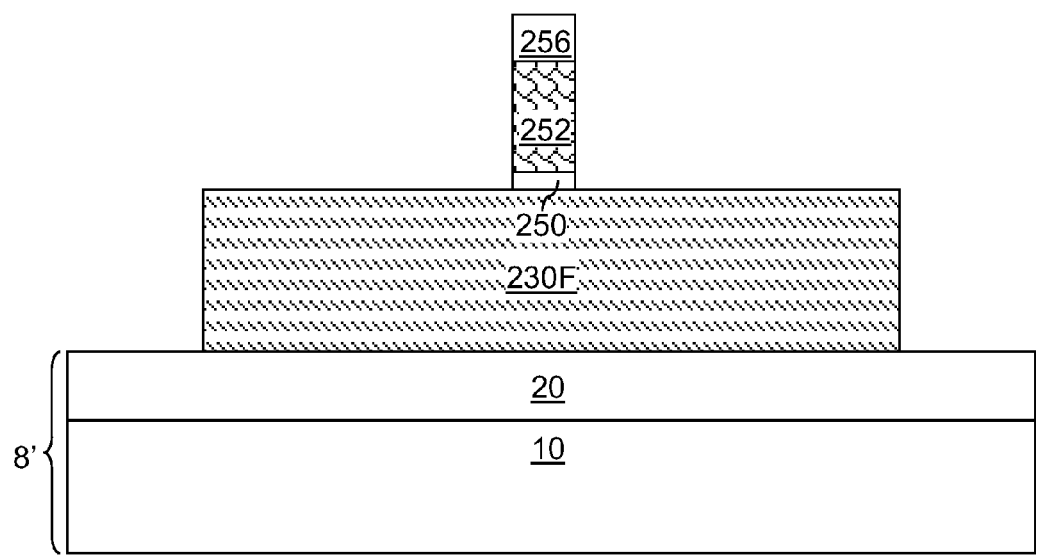

Referring to FIGS. 6A and 6B, a second exemplary semiconductor structure can be formed by providing an SOI substrate including a handle substrate 10, a buried insulator layer 20, and a top semiconductor layer, and by patterning the top semiconductor layer to form semiconductor fins 230F. Method of forming semiconductor fins 230F from an SOI substrate is known in the art. The stack of the handle substrate 10 and the buried insulator layer 20 is herein referred to as a substrate 8'.

A gate stack is formed on the semiconductor fins 230F and the substrate 8' by deposition and patterning of gate stack layers. The patterning of the gate stack layers can be effected by application of a photoresist (not shown), lithographic patterning of the photoresist, transfer of the pattern in the photoresist into the gate stack layers, and removal of the photoresist, for example, by ashing. A gate stack includes at least a gate dielectric 250 and a gate electrode 252, and can optionally include a gate cap dielectric 256.

The gate dielectric 250 can include the same material as the gate dielectric 50 in the first embodiment. The gate electrode 252 can include the same material as the gate electrode 52 in the first embodiment. The gate cap dielectric 256, if employed, can include the same dielectric material as the gate cap dielectric 56 in the first embodiment.

In one embodiment, the semiconductor fin 230F includes an intrinsic semiconductor material, i.e., an undoped semiconductor material.

In another embodiment, the semiconductor fin 230F includes a doped semiconductor material. In this case, the conductivity type of the semiconductor material in the semiconductor fins 230F is herein referred to as a first conductivity type. The first conductivity type can be p-type or n-type.

Figure 7A:
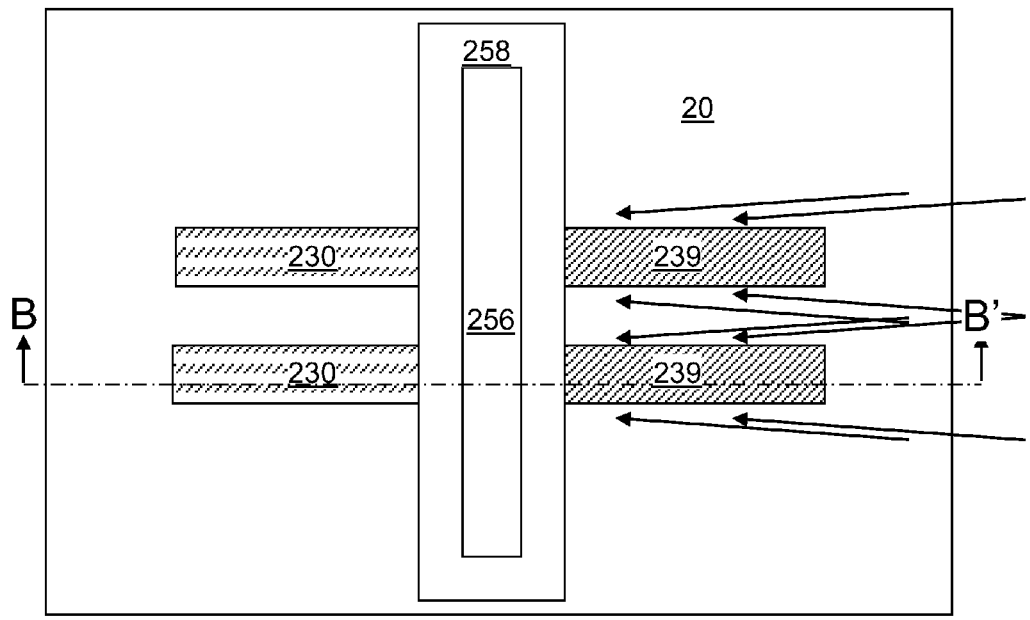
FIGS. 7A, 7B, and 7C are views of the second exemplary semiconductor structure during angled ion implantation of a dopant to form structurally damaged regions according to the second embodiment of the present disclosure.
Figure 7B:
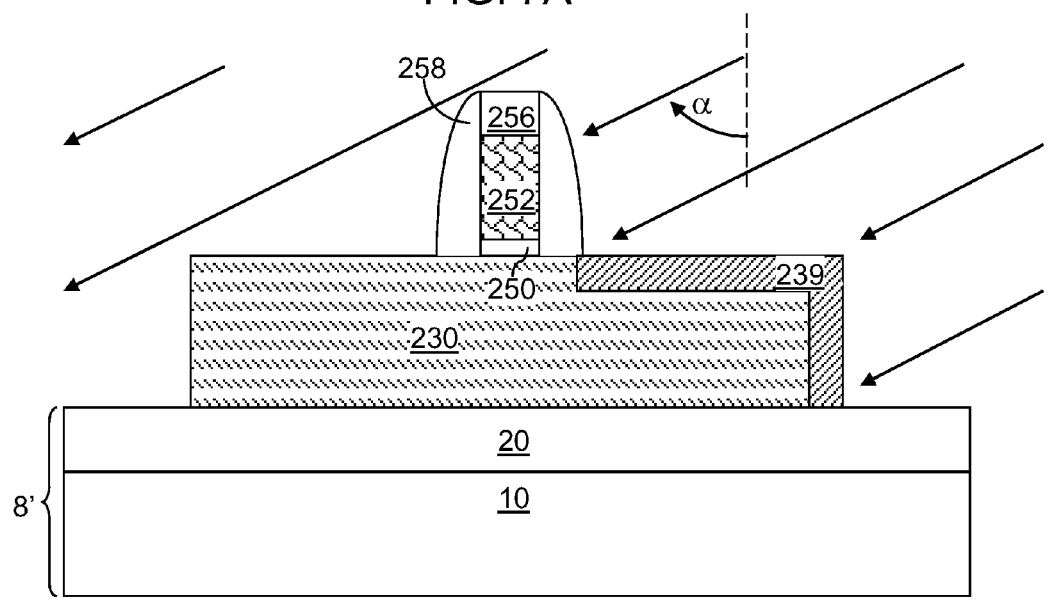
Figure 7C:
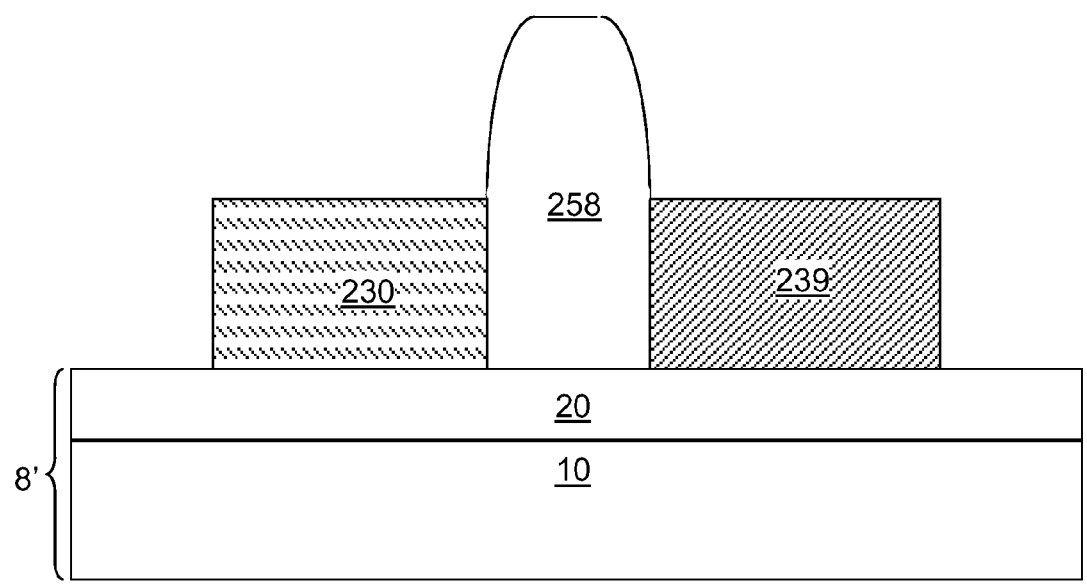

Referring to FIGS. 7A, 7B, and 7C, a gate spacer 258 including a dielectric material can be formed around the gate stack (250, 252, 256). The gate spacer 258 can be formed, for example, by deposition of a conformal dielectric material layer and selective removal of horizontal portions of the deposited conformal dielectric material layer. The remaining vertical portions of the deposited conformal dielectric material layer constitute the gate spacer 58. Dielectric materials that can be employed for the gate spacers 58 include silicon oxide, silicon nitride, silicon oxynitride, and combinations thereof. It is noted that the thickness of the gate cap dielectric 256 can be adjusted and the height of the top of the gate spacer 258 can be adjusted below the top surface of the gate cap dielectric 256 as long as the sidewalls of the gate electrode 252 are completely covered by the gate spacer 258. Further, it is noted that in some embodiments, a residual dielectric spacer (not shown) may be present around the bottom portions of the semiconductor fins 230F. The residual dielectric spacer may be eliminated or minimized by selecting dimensions of the height of the semiconductor fins 230F and the thickness of the gate cap dielectric 256 and the etch time during the anisotropic etch that forms the gate spacer 258.

Angled ion implantation of a dopant is performed to form structurally damaged regions 239. As measured in B-B' plane, the ion implantation is performed at an angle $\alpha$ relative to the surface normal of the top surface of the substrate 8'. The angle $\alpha$ can be from 5 degrees to 60 degrees, although lesser and greater angles can also be employed.

Because the gate stack (250, 252, 256) and the gate spacer 258 block the path of the ion beam during the ion implantation, a surface portion of the semiconductor material portion at one side of the gate stack (250, 252, 256), which is herein referred to as a drain side, is implanted with the ions, while another surface portion of the semiconductor material portion at the other side, which is herein referred to as a source side, of the gate stack (250, 252, 256) or directly below the gate stack (250, 252, 256) is not implanted with the ions. Thus, structurally damaged regions 239, which include an imperfectly-single crystalline semiconductor material, are formed by conversion of surface portions of the semiconductor fins 230F on the drain side. The structurally damaged regions 239 are not amorphous, not polycrystalline, and not completely epitaxial, but only partially epitaxial due to dislocations of a significant portion of atoms from their epitaxial atomic sites. In one embodiment, at least 1% of the atoms in the structurally damaged regions 239 are displaced from the epitaxial crystal sites, i.e., from the ideal sites for a perfectly epitaxial crystal. The remaining portions of the semiconductor fins 230F are herein referred to as semiconductor fin portions 230.

In one embodiment, the direction of the angled ion implantation can also have a non-zero angle in a top-down view, e.g., the view of FIG. 7A, relative to the vertical plane including the lengthwise direction of the semiconductor fins (230, 239), i.e., relative to the plane of B-B'. In this case, the structurally damaged regions 239 extend to sidewalls of the semiconductor fin (230, 239) as illustrated in FIG. 7C, which is a side view of the second exemplary structure in a direction perpendicular to the B-B' plane in FIG. 7A. The two portions of a structurally damaged portion 239 that are formed on two opposing sidewalls of a semiconductor fin (230, 239) may, or may not, merge within the semiconductor fin (230, 239). FIG. 7B illustrates an embodiment in which the two portions of the structurally damaged portion 239 formed on two opposing sidewalls of a semiconductor fin (230, 239) do not merge.

The source side surfaces of the semiconductor fins (230, 239) are shielded from ions during the ion implantation, and the drain side surfaces of the semiconductor fins (230, 239) are not shielded from ions during the ion implantation.

The ion implantation step implants ions into the structurally damaged regions 239. The ions remain in the structurally damaged regions 239, and alter the composition of the structurally damaged regions 239. As such, the ions incorporated into the structurally damaged regions 239 are dopants.

The implanted dopant can be at least one Group IVA element, which can be the same as, or can be different from, the composition of the semiconductor material in the semiconductor fin (230, 239) in the same manner as in the first embodiment. In one embodiment, the implanted dopant is at least one Group IVA element that is different from the composition of the semiconductor material in the semiconductor material region as originally provided.

In another embodiment, the implanted dopant can include at least one electrical dopant that is selected from Group IIIA elements and Group VA elements in the same manner as in the first embodiment.

In yet another embodiment, the implanted dopant can include at least one noble gas, which includes He, Ne, Ar, Kr, and Xe in the same manner as in the first embodiment.

Further, any combination of the at least one Group IVA element, at least one electrical dopant selected from Group IIIA elements and Group VA elements, and at least one noble gas can be employed to implant dopants into the structurally damaged regions 239 in the same manner as in the first embodiment.

The dose of the ion implantation is selected such that sufficient structural damage is made to the crystal structure in the semiconductor material of the structurally damaged regions 239 so that the rate epitaxial growth is retarded on the surface of the structurally damaged region 39 in a subsequent epitaxy step.

Figure 8A:
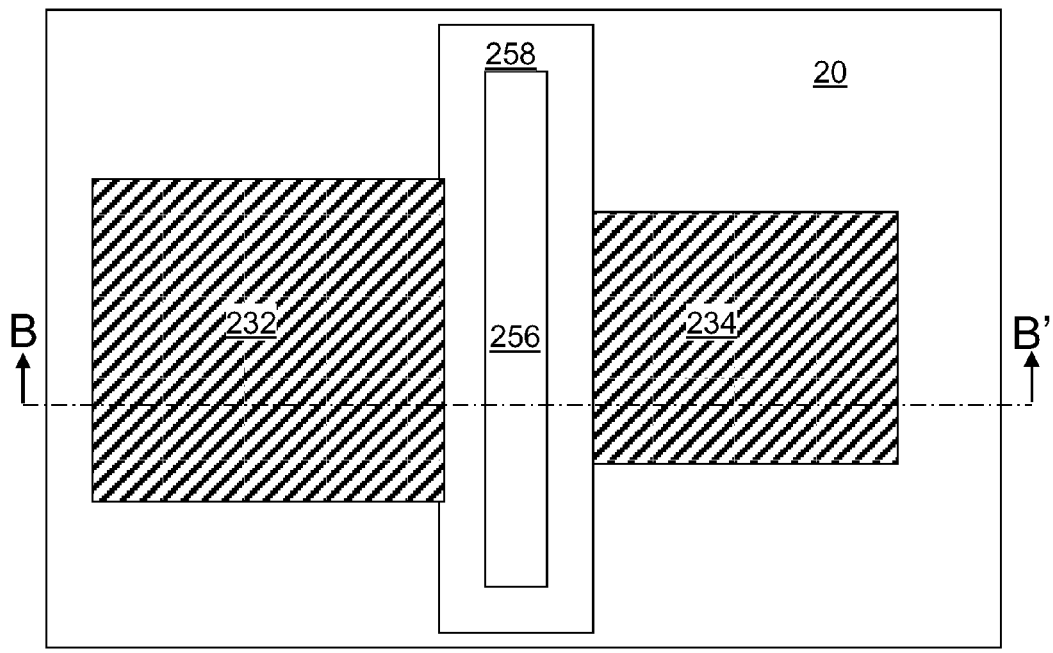
FIGS. 8A and 8B are views of the second exemplary semiconductor structure after formation of a source-side raised epitaxial semiconductor region and a drain-side raised epitaxial semiconductor region by selective epitaxy with in-situ doping according to the second embodiment of the present disclosure.
Figure 8B:
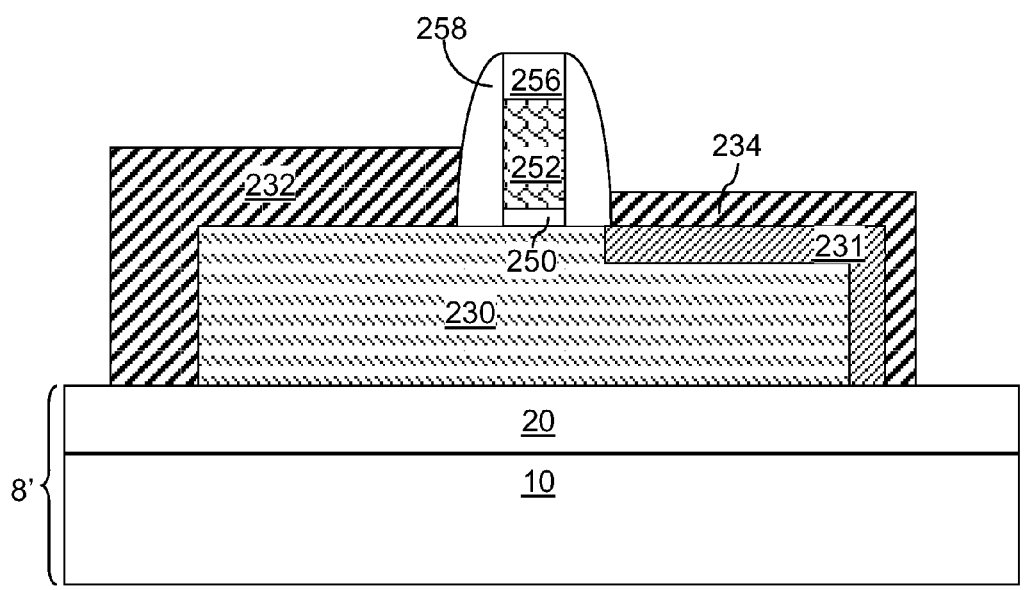

Referring to FIGS. 8A and 8B, selective epitaxy is performed to deposit a semiconductor material on the exposed semiconductor surfaces of the structurally damaged regions 239 and the semiconductor fin portions 230. The same selective epitaxy process can be employed as in the first embodiment. Because the structurally damaged regions 239 include surface defects that impede the mobility of adatoms from the reactant, an epitaxial semiconductor material portion deposited on the structurally damaged regions 239 has a lesser thickness than another epitaxial semiconductor material portion deposited directly on the semiconductor fin portions 230.

Because the selective epitaxy is performed at an elevated temperature that is sufficient to provide surface diffusion for the semiconductor material that is deposited, the underlying semiconductor material in the structurally damaged region 239 is subject to bulk diffusion. Thus, the selective epitaxy process operates as an anneal process that gradually cures the structural defects in the structurally damaged regions 239, thereby converting the structurally damaged regions 239 into buried epitaxial semiconductor material regions 231.

The selective epitaxy process provides in-situ doping of the deposited semiconductor material with electrical dopants of a second conductivity type, which is the opposite of the first conductivity type. In this case, a raised drain region 234 is formed directly on the buried epitaxial semiconductor material regions 231, and a raised drain region 232 is formed directly on the surfaces of the semiconductor fin portions 230. The selective epitaxy process forms the raised drain region 234 directly on the structurally damaged regions 239. Thus, by the end of the selective epitaxy process, the raised drain region 234 is present directly on the buried epitaxial semiconductor material regions 231. Because of the retardation of the growth rate of the semiconductor material by the surface defects in the structurally damaged regions 239 during the initial stage of the selective epitaxy process, the raised source region 232 have a greater thickness than the raised drain region 232.

In one embodiment, the thickness of the deposited in-situ doped semiconductor material is sufficient to cause the various deposited semiconductor material portions on the buried epitaxial semiconductor material regions 231 to merge, thereby forming a raised drain region 234 of integral construction (i.e., in a single contiguous piece) contacting a plurality of buried epitaxial semiconductor material regions 231. Likewise, the various deposited semiconductor material portions formed on a plurality of semiconductor fin portions 230 can also merge, thereby forming a raised source region 232 of integral construction contacting the plurality of semiconductor fin portions 230.

The semiconductor material of the raised drain region 234 is the same as the semiconductor material of the raised source region 232. The semiconductor material of the raised drain region 234 and the raised source region 232 can be the same as, or can be different from the semiconductor material of the semiconductor fin portions 230. The semiconductor material of the raised drain region 234 and the raised source region 232 can be an elemental semiconductor material, an alloy of at least two elemental semiconductor materials, a compound semiconductor material, or a stack thereof.

In one embodiment, at least one additional dielectric gate spacer (not shown) can be deposited, and an addition ion implantation can be performed to implant additional dopants of the second conductivity type in regions of the end portions of the semiconductor fins (230, 231) that are laterally spaced from the gate stack (250, 252, 256) by the gate spacer 258 and the at least one additional dielectric gate spacer.

Figure 9A:
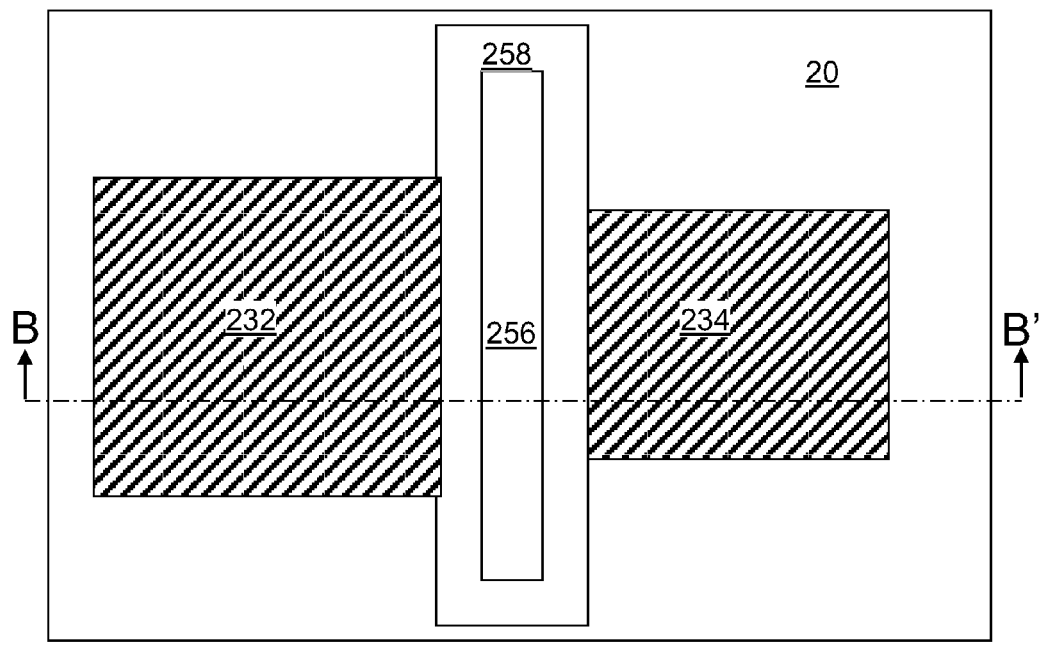
FIGS. 9A and 9B are views of the second exemplary semiconductor structure after an anneal that laterally extends buried source regions and buried drain regions in the semiconductor fins according to the second embodiment of the present disclosure.
Figure 9B:
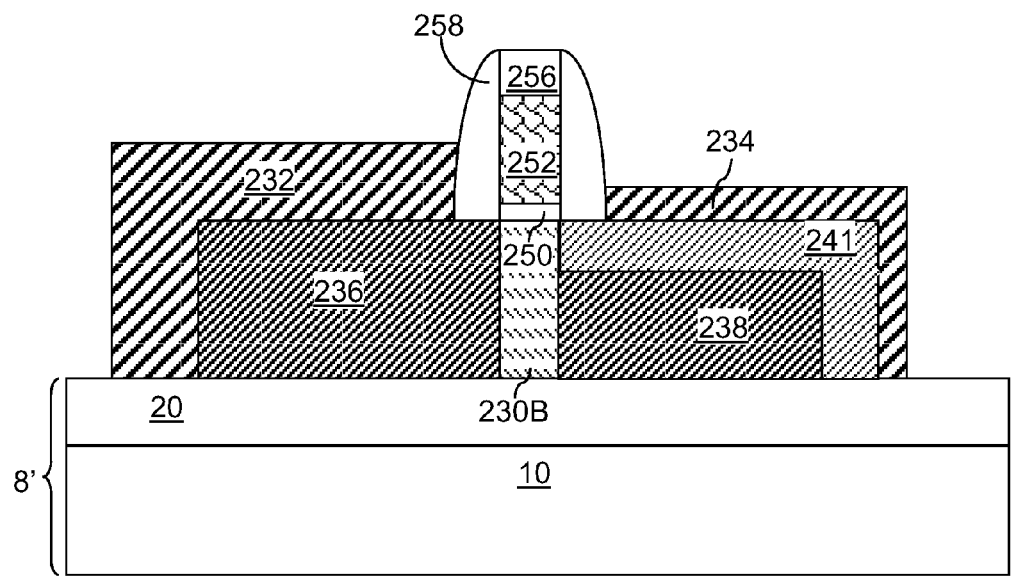

Referring to FIGS. 9A and 9B, the second exemplary structure is annealed at an elevated temperature that is sufficiently high to induce bulk diffusion of the dopants of the second conductivity type within the raised drain region 234 and the raised source region 232 to diffuse into the semiconductor fin (230, 231). The temperature of the anneal can be, for example, from 600° C. to 1,100° C., and the duration of the anneal can be from 1 second to 6 hours, although lesser and greater temperatures and/or shorter or longer anneal time can also be employed.

A portion of each semiconductor fin portions 230 laterally and vertically contacted by the raised source region 232 is converted into a buried source region 236 having a doping of the second conductivity type. The raised source region 232 and the buried source regions 236 are herein referred to as a source region (232, 236), which functions as a source of a field effect transistor.

The buried epitaxial semiconductor material regions 231 are doped with the dopants of the second conductivity type to become upper buried drain regions 241. The upper buried drain region 241 includes the dopants that caused structural damages in the structurally damaged region 239 discussed above. Because the anneal at the elevated temperature causes the dopants to diffuse out, the volume of each upper buried drain region 241 may be greater than the volume of the corresponding buried epitaxial semiconductor material regions 231 prior to the anneal.

A lower buried drain region 238 is formed by diffusion of the dopants of the second conductivity type into portions of the semiconductor fin portions 230 located on the drain side and underneath a top portion of the upper buried drain region 241. A pair of a lower buried drain region 238 and an overlying upper buried drain region 241 constitutes a buried drain region (238, 241). The raised drain region 234 and the buried drain region (238, 241) are herein referred to as a drain region (238, 241, 234), which functions as a drain of a field effect transistor.

The temperature and the duration of the anneal is controlled so that a portion of each semiconductor fin portion 230 beneath the gate stack (250, 252, 256) is not converted into a region having a doping of the second conductivity type. Each remaining portion of the semiconductor fin portions 230 is herein referred to as a body region 230B, which functions as a body of the field effect transistor.

The raised drain regions 234 and the raised source regions 232 have the same semiconductor composition. The buried source regions 236 and the lower buried drain regions 238 have the same semiconductor composition. The semiconductor composition of the buried source regions 236 and the lower buried drain regions 238 can be the same as, or can be different from, the semiconductor composition of the raised drain region 234 and the raised source region 232, provided that the lattice constant and the lattice structure of the semiconductor material of the raised drain region 234 and the raised source region 232 are compatible with epitaxial semiconductor deposition process directly on the surface of the semiconductor material of the buried source regions 236 and the lower buried drain regions 238.

In one embodiment, the raised source region 232 and raised drain region 234 can have a same composition throughout. The same composition can include a semiconductor material and at least one electrical dopant of the second conductivity type at a uniform dopant concentration.

The upper buried drain regions 241 have another composition that includes the at least one electrical dopant in the raised source region 232 and the raised drain region 234 and an additional dopant at an additional dopant concentration. As discussed above, the additional dopant can include at least one Group IVA element, at least one electrical dopant, at least one noble gas, or a combination thereof. The lower buried drain regions 238 and the buried source regions 232 have yet another composition that differs from the composition of the upper buried drain regions 241 by the absence of the additional dopant.

The buried drain regions (238, 241) and the buried source regions 236 have topmost surfaces that are coplanar with the bottom surface of the gate dielectric 250. Each buried source region 236 is located below a top portion of the raised source region 232, and each buried drain region (238, 241) is located below a top portion of the raised drain region 234.

Figure 10A:
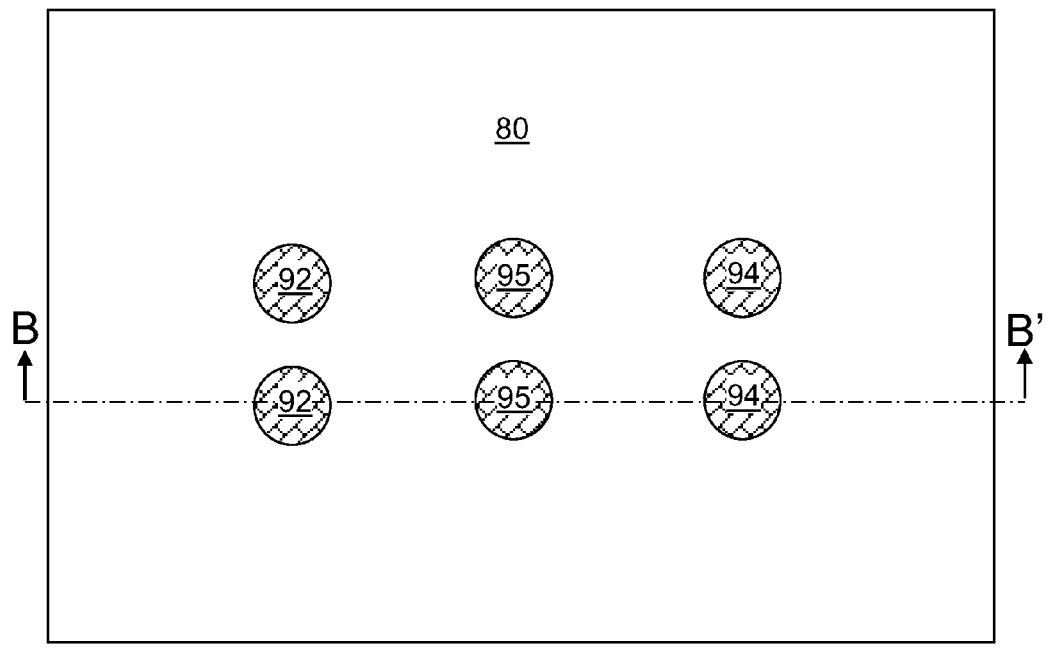
FIGS. 10A and 10B are views of the second exemplary semiconductor structure after formation of a contact-level dielectric layer and contact via structures therein according to the second embodiment of the present disclosure.
Figure 10B:
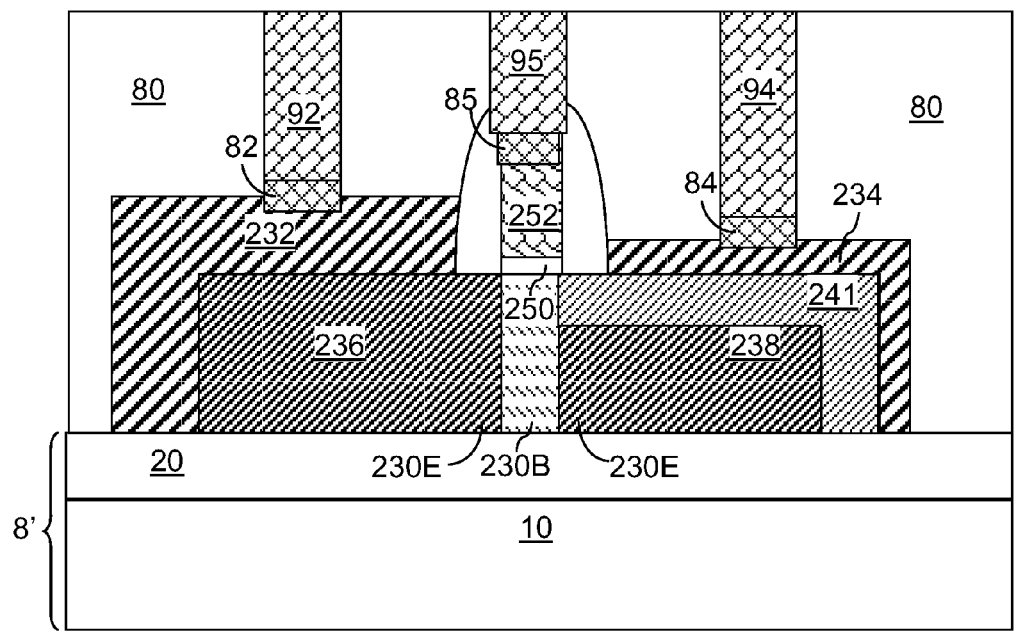

Referring to FIGS. 10A and 10B, a contact-level dielectric layer 80 and various contact via structures are formed. The contact-level dielectric layer 80 can include any material that can be employed as a dielectric material in metal interconnect structures. For example, the contact-level dielectric layer 80 can include doped or undoped silicate glass, silicon nitride, organosilicate glass, or a combination thereof. The contact via structures can include at least one source-side contact via structure 92, at least one drain-side contact via structure 94, and at least one gate-side contact via structure 95. Optionally, various metal semiconductor alloy regions can be formed by reacting a metal and an underlying semiconductor material. The various metal semiconductor alloy regions can include, for example, at least one source-side metal semiconductor alloy region 82, at least one drain-side metal semiconductor alloy region 84, and/or at least one gate-side metal semiconductor alloy region 85.

Figure 11A:
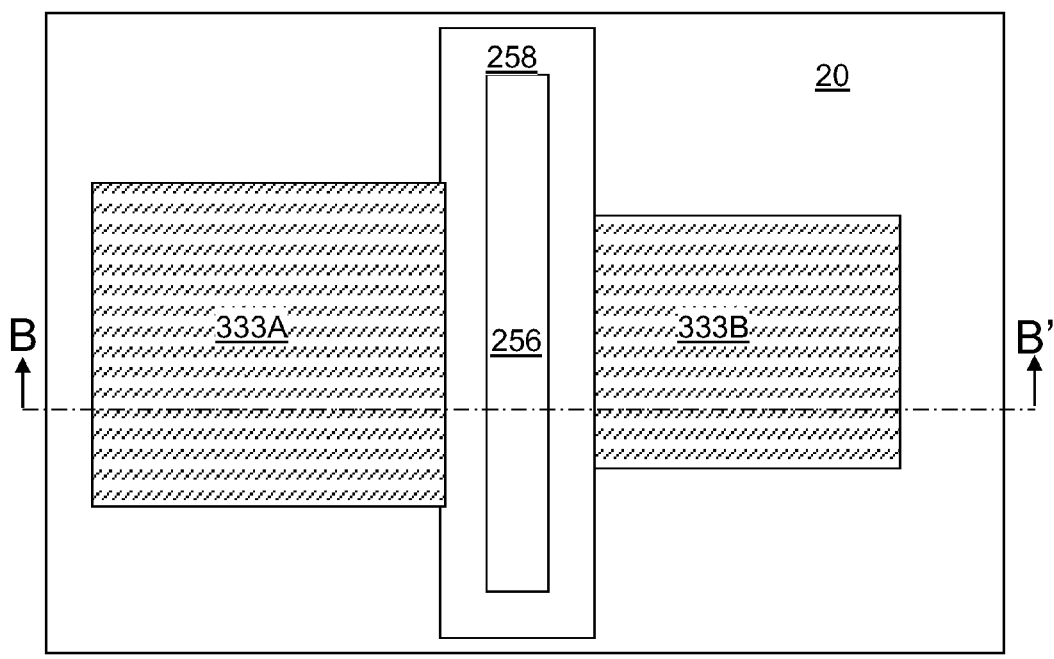
FIGS. 11A and 11B are views of a third exemplary semiconductor structure after formation of a source-side raised epitaxial semiconductor region and a drain-side raised epitaxial semiconductor region according to a third embodiment of the present disclosure.
Figure 11B:
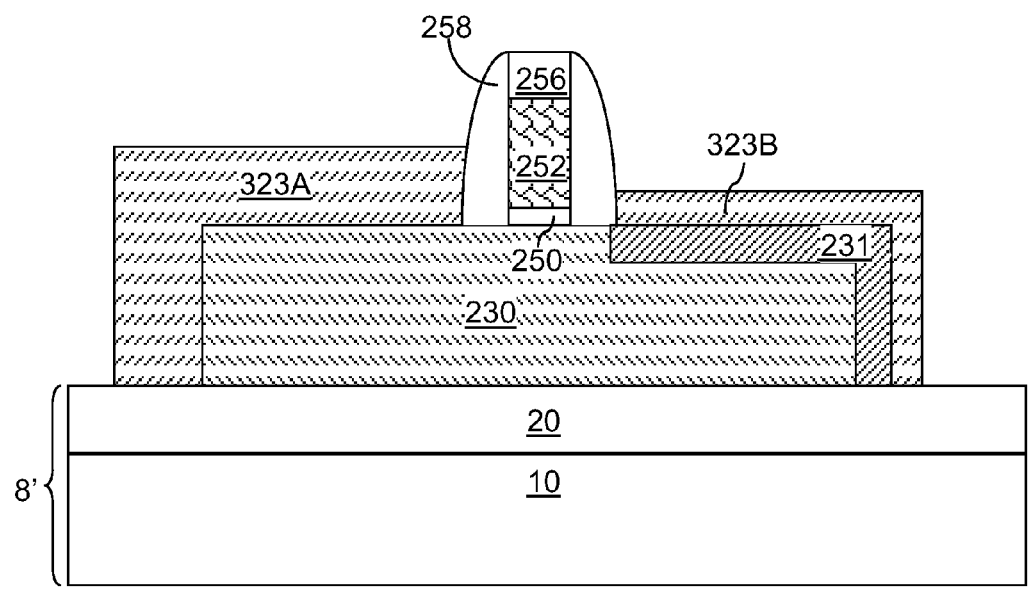

Referring to FIGS. 11A and 11B, a third exemplary semiconductor structure according to a third embodiment of the present disclosure can be derived from the second exemplary semiconductor structure of FIGS. 7A, 7B, and 7C by selectively depositing an intrinsic semiconductor material instead of an in-situ doped semiconductor material. Specifically, selective epitaxy is performed to deposit an intrinsic semiconductor material on the exposed semiconductor surfaces of the structurally damaged regions 239 (See FIGS. 7A, 7B, and 7C) and the semiconductor fin portions 230. Because the structurally damaged regions 239 include surface defects that impede the mobility of adatoms from the reactant, an epitaxial semiconductor material portion deposited on the structurally damaged regions 239 has a lesser thickness than another epitaxial semiconductor material portion deposited directly on the semiconductor fin portions 230.

Because the selective epitaxy is performed at an elevated temperature that is sufficient to provide surface diffusion for the semiconductor material that is deposited, the underlying semiconductor material in the structurally damaged region 239 is subject to bulk diffusion. Thus, the selective epitaxy process operates as an anneal process that gradually cures the structural defects in the structurally damaged regions 239, thereby converting the structurally damaged regions 239 into buried epitaxial semiconductor material regions 231. During the selective epitaxy process, a drain-side raised epitaxial semiconductor region 323B is formed directly on the structurally damaged regions 239. By the end of the selective epitaxy process, the drain-side raised epitaxial semiconductor regions 323B are present directly on the buried epitaxial semiconductor material regions 231. Further, a source-side raised epitaxial semiconductor regions 323A is formed directly on the exposed surfaces of each semiconductor fin portions 230. The source-side raised epitaxial semiconductor regions 323A have a greater thickness than the drain-side raised epitaxial semiconductor regions 323B.

The semiconductor material of the source-side raised epitaxial semiconductor regions 323A is the same as the semiconductor material of the drain-side raised epitaxial semiconductor regions 323B. The semiconductor material of the source-side raised epitaxial semiconductor regions 323A and the drain-side raised epitaxial semiconductor regions 323B can be the same as, or can be different from the semiconductor material of the semiconductor fin portions 230. The semiconductor material of the source-side raised epitaxial semiconductor regions 323A and the drain-side raised epitaxial semiconductor regions 323B can be an elemental semiconductor material, an alloy of at least two elemental semiconductor materials, a compound semiconductor material, or a stack thereof.

Because the selective epitaxy process deposits an intrinsic, i.e., undoped, semiconductor material, the drain-side raised epitaxial semiconductor regions 323B and the source-side raised epitaxial semiconductor region 323A include an intrinsic epitaxial semiconductor material. A thicker semiconductor material is deposited in the source-side raised epitaxial semiconductor region 323A than in the drain-side raised epitaxial semiconductor region 323B due to retardation of epitaxial growth on the structurally damaged regions 239 relative to the source side surface, i.e., the surfaces of the semiconductor fin portions 230 on the source side, during the deposition of the intrinsic semiconductor material by selective epitaxy.

Figure 12A:
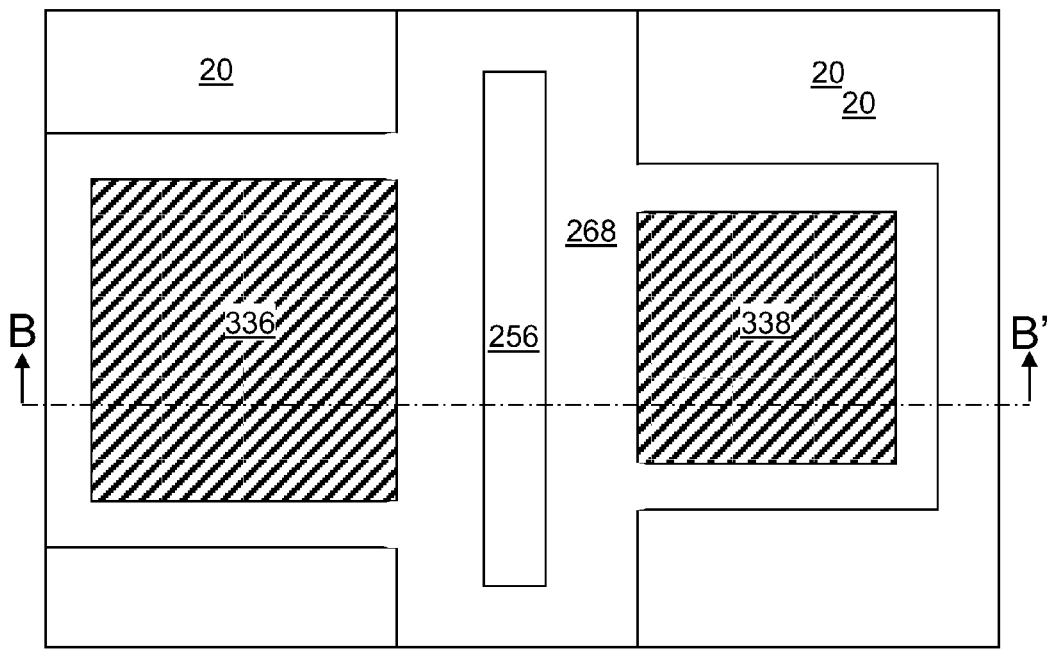
FIGS. 12A and 12B are views of the third exemplary semiconductor structure after formation of a second gate spacer, an epitaxial raised source region, and an epitaxial raised drain according to the third embodiment of the present disclosure.
Figure 12B:
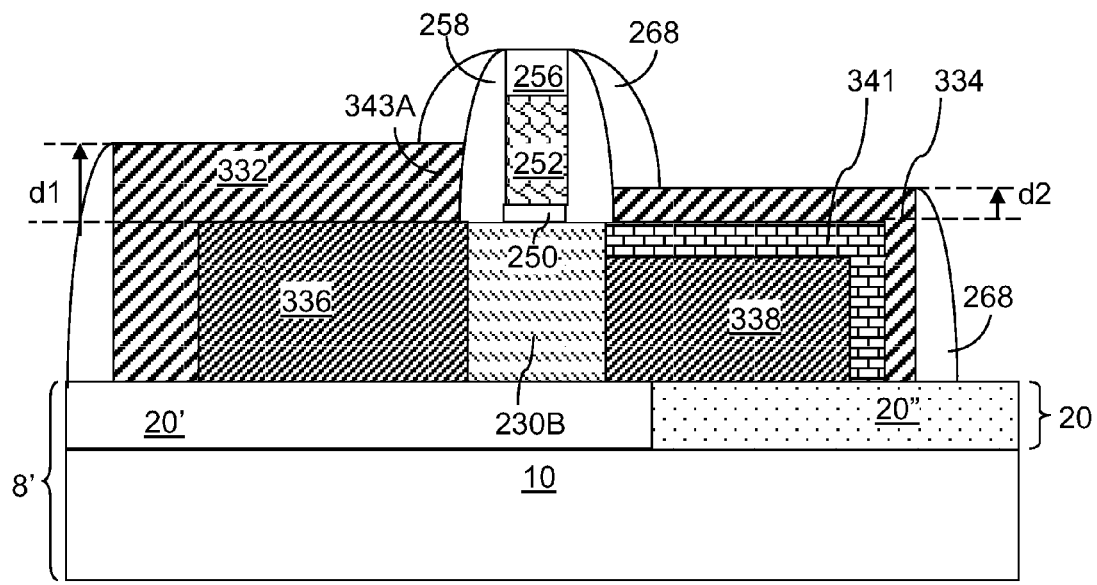

Referring to FIGS. 12A and 12B, at least one additional dielectric spacer 268 can be formed around the gate spacer 258 and above the top surfaces of peripheral portions of the drain-side raised epitaxial semiconductor region 3233B and the source-side raised epitaxial semiconductor region 3233A that are proximal to the gate stack (250, 252, 256). The total width of the at least one additional dielectric spacer 268 can be from 3 nm to 100 nm, although lesser and greater total widths can also be employed.

Electrical dopants of the second conductivity type are implanted into the drain-side raised epitaxial semiconductor regions 323B, the source-side raised epitaxial semiconductor regions 323A, and end portions of the semiconductor fin portions 230, for example, by ion implantation. Optionally, an anneal at an elevated temperature can be performed to induce diffusion of the implanted dopants. The temperature of the anneal can be, for example, from 600° C. to 1,100° C., and the duration of the anneal can be from 1 second to 6 hours, although lesser and greater temperatures and/or shorter or longer anneal time can also be employed.

Each of the drain-side raised epitaxial semiconductor regions 323B becomes a raised drain regions 334. Each of the buried epitaxial semiconductor material regions 231 becomes an upper buried drain region 341, which includes all of the materials in the buried epitaxial semiconductor material regions 231 and the additional electrical dopants of the second conductivity type added by the ion implantation. Each portion at a drain end of the semiconductor fin portions 230 that is implanted with the additional electrical dopants of the second conductivity type becomes a lower buried drain region 338.

Each source-side raised epitaxial semiconductor region 323A that is doped with additional dopants of the second conductivity type becomes a raised source regions 332. Each portion at a source end of the semiconductor fin portions 230 that is implanted with the additional electrical dopants of the second conductivity type becomes a buried source region 336.

The raised drain region 334 and the raised source region 332 have the same material composition. The buried source regions 336 and the lower buried drain regions 338 have the same material composition. The semiconductor composition, i.e., the composition of the semiconductor material excluding any electrical dopants, of the buried source regions 336 and the lower buried drain regions 338 can be the same as, or can be different from, the semiconductor composition of the raised drain region 334 and the raised source region 332, provided that the lattice constant and the lattice structure of the semiconductor material of the raised drain region 334 and the raised source region 332 are compatible with epitaxial semiconductor deposition process directly on the surface of the semiconductor material of the buried source regions 336 and the lower buried drain regions 338.

The buried source regions 336 and the raised source region 332 collectively constitute a source region (36, 32), which functions as a source of the field effect transistor. The lower buried drain regions 338, the upper buried drain regions 341, and the raised drain region 334 collectively constitutes a drain region (338, 341, 334), which functions as a drain of the field effect transistor. The raised source region 332 has a top surface at a first distance d1 from a bottom surface of a gate dielectric 50, and the raised drain region 334 has a top surface at a second distance d2 from the bottom surface of the gate dielectric 50, and the first distance d1 is greater than the second distance d2 by at least 1 nm. In one embodiment, the first distance d1 is greater than the second distance d2 by at least 5 nm. The thickness of the raised drain region 334 can be from 1 nm to 30 nm, although lesser and greater thicknesses can also be employed.

In one embodiment, the raised source regions 332 and raised drain regions 334 can have a same composition throughout. The same composition can include a semiconductor material and at least one electrical dopant of the second conductivity type at a uniform dopant concentration.

The upper buried drain regions 341 have another composition that includes the at least one electrical dopant at the dopant concentration in the raised source region 332 and the raised drain regions 334 and an additional dopant at an additional dopant concentration. As discussed above, the additional dopant can include at least one Group IVA element, at least one electrical dopant, at least one noble gas, or a combination thereof. The lower buried drain regions 338 and the buried source regions 332 have yet another composition that differs from the composition of the upper buried drain regions 341 by the absence of the additional dopant. A stack of an upper buried drain region 341 and a lower buried drain region 338 collectively constitute a buried drain region (338, 341).

The buried drain regions (338, 341) and the buried source regions 336 have topmost surfaces that are coplanar with a bottom surface of a gate dielectric 250. Each buried source region 336 is located below a top portion of the raised source region 232, and each buried drain region (338, 341) is located below a top portion of the raised drain region 334.

In one embodiment, the depth of ion implantation of the electrical dopants of the second conductivity type can be adjusted so that the electrical dopants of the second conductivity type are not implanted to portions of the buried insulator layer 20 underlying the buried source regions 336, while the electrical dopants of the second conductivity type are implanted into portions of the buried insulator layer 20 underlying the buried drain regions (338, 341). In this case, a doped buried insulator portion 20" can be formed underneath the buried drain regions (338, 341). The buried insulator layer 20 includes an undoped buried insulator portion 20' and doped buried insulator portions 20".

While the illustrated structure of FIGS. 12A and 12B illustrates embodiments in which the electrical dopants of the second conductivity type are implanted into the semiconductor fin portions 230, embodiments can also be employed in which the depth of ion implantation is controlled such that the electrical dopants are not implanted into the semiconductor fin portions 230. In this case, the electrical dopants of the second conductivity type can be implanted into the drain-side raised epitaxial semiconductor regions 323B and an upper portion of the source-side raised epitaxial semiconductor regions 323A and optionally into the buried epitaxial semiconductor material regions 231.

Figure 13A:
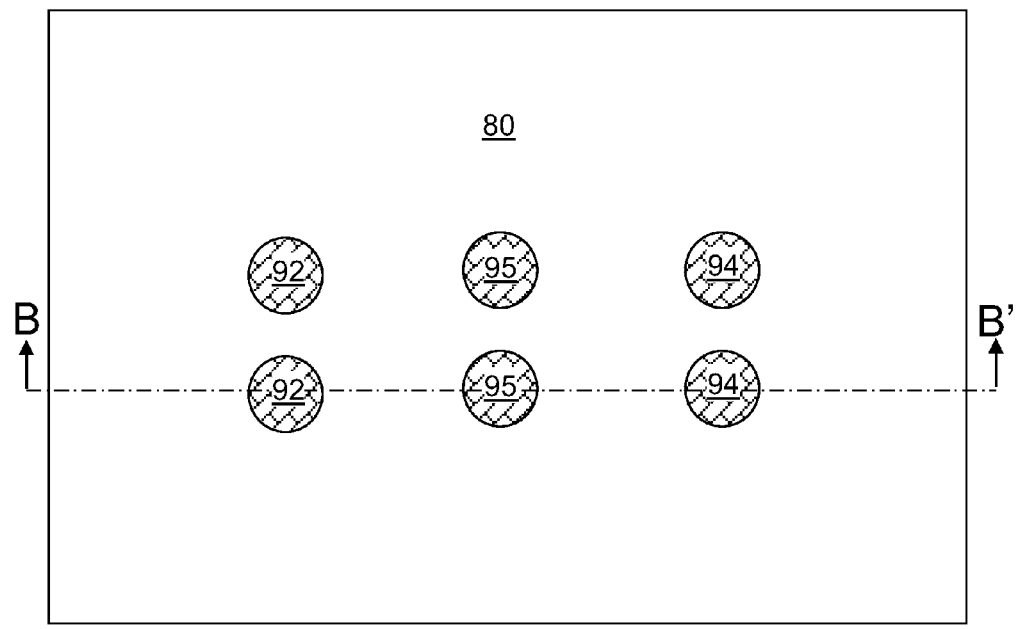
FIGS. 13A and 13B are views of the third exemplary semiconductor structure after formation of a contact-level dielectric layer and contact via structures therein according to the third embodiment of the present disclosure.
Figure 13B:
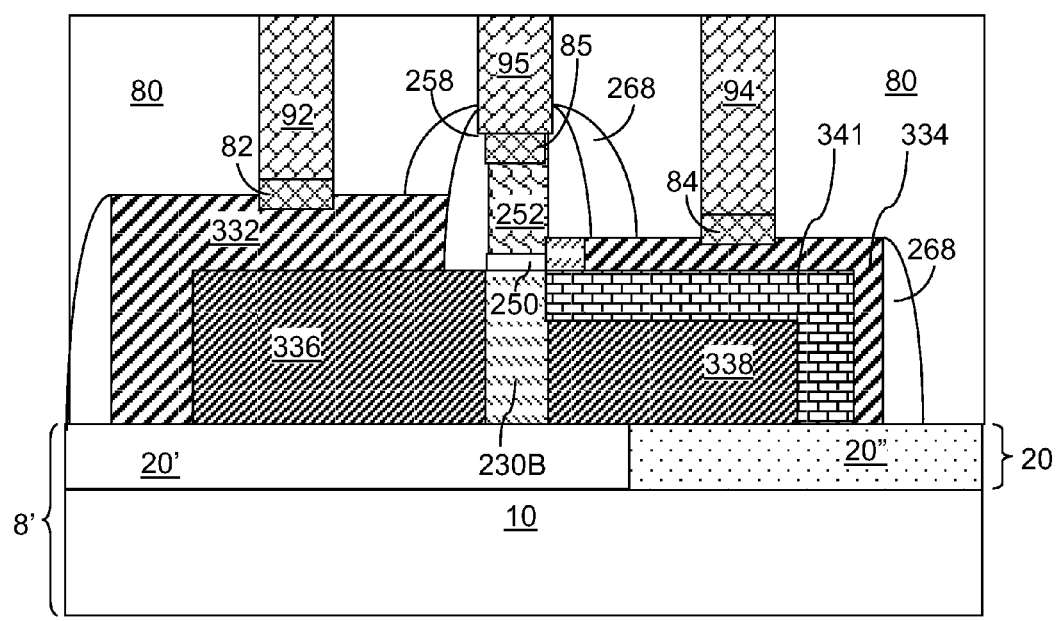

Referring to FIGS. 13A and 13B, a contact-level dielectric layer 80 and various contact via structures are formed. The contact-level dielectric layer 80 can include any material that can be employed as a dielectric material in metal interconnect structures. For example, the contact-level dielectric layer 80 can include doped or undoped silicate glass, silicon nitride, organosilicate glass, or a combination thereof. The contact via structures can include at least one source-side contact via structure 92, at least one drain-side contact via structure 94, and at least one gate-side contact via structure 95. Optionally, various metal semiconductor alloy regions can be formed by reacting a metal and an underlying semiconductor material. The various metal semiconductor alloy regions can include, for example, at least one source-side metal semiconductor alloy region 82, at least one drain-side metal semiconductor alloy region 84, and/or at least one gate-side metal semiconductor alloy region 85.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising a field effect transistor, said field effect transistor including:
    a gate stack including a gate dielectric and a gate electrode and located on a substrate;
    a raised source region having a top surface at a first distance from a horizontal plane including a bottom surface of said gate dielectric and a planar bottom surface contained within said horizontal plane;
    a raised drain region having a top surface at a second distance from said horizontal surface, wherein said first distance is greater than said second distance; and
    a buried source region contacting said planar bottom surface of said raised source region, wherein said buried source region and said raised source region comprise different semiconductor materials or have different dopant concentrations.

2. The semiconductor structure of claim 1, wherein said raised source region and raised drain region have a composition including a semiconductor material and at least one electrical dopant.

3. The semiconductor structure of claim 1, wherein said field effect transistor further comprises a buried drain region having a topmost surface that is coplanar with a bottom surface of said gate dielectric, wherein said buried source region has a topmost surface that is coplanar with said bottom surface of said gate dielectric.

4. The semiconductor structure of claim 1, wherein said field effect transistor is a planar field effect transistor, wherein said buried source region is located below said raised source region, and wherein said planar field effect transistor further comprises a buried drain region that is located below said raised drain region, wherein a top surface of said buried drain region and a top surface of said buried drain region are coplanar with a bottom surface of said gate dielectric.

5. The semiconductor structure of claim 1, wherein said field effect transistor is a fin field effect transistor comprising:
    an insulator layer located in said substrate;
    at least one semiconductor fin including a fin source region on one end and a fin drain region in another end, wherein said fin source region is said buried source region, wherein sidewalls and a top surface of said fin source region contacts said raised source region, sidewalls and a top surface of said fin drain region contacts said raised drain region, and said top surface of said fin source region and said top surface of said fin drain region are coplanar with a bottom surface of said gate dielectric.

6. The semiconductor structure of claim 1, wherein said raised drain region has a planar bottom surface located within said horizontal plane.

7. The semiconductor structure of claim 6, further comprising a semiconductor material layer having a top surface contained within said horizontal plane and having a different semiconductor material than said raised source region and said raised drain region.

8. The semiconductor structure of claim 6, further comprising a semiconductor fin having a top surface contained within said horizontal plane and having a different semiconductor material than said raised source region and said raised drain region.

9. The semiconductor structure of claim 1, further comprising a buried drain region underlying said raised drain region, wherein said buried source region has a greater thickness than said buried drain region.

10. The semiconductor structure of claim 1, wherein said buried source region is located within a semiconductor layer in said substrate, and said semiconductor structure further comprises a buried drain region located within said semiconductor layer and in contact with said raised drain region.

11. The semiconductor structure of claim 1, further comprising an upper buried drain region contacting a bottom surface of said raised drain region, wherein said raised source region, said raised drain region, and said upper buried drain region include at least one common electrical dopant, and said upper buried drain region includes an additional dopant that is not present in said raised source region and said raised drain region.

12. A semiconductor structure comprising a field effect transistor, said field effect transistor including:
    a gate stack including a gate dielectric and a gate electrode and located on a substrate;
    a raised source region having a top surface at a first distance from a bottom surface of said gate dielectric and a bottom surface;
    a raised drain region having a top surface at a second distance from said bottom surface of said gate dielectric, wherein said first distance is greater than said second distance, wherein said raised source region and raised drain region have a composition including a semiconductor material and at least one electrical dopant;
    an upper buried drain region having another composition, said another composition including said at least one electrical dopant and an additional dopant; and
    a buried source region having yet another composition that differs from said another composition by absence of said additional dopant.

13. The semiconductor structure of claim 12, wherein said field effect transistor further comprises a lower buried drain region having said yet another composition.

14. A semiconductor structure comprising a field effect transistor, said field effect transistor including:
    a gate stack including a gate dielectric and a gate electrode and located on a substrate;
    a raised source region having a top surface at a first distance from a bottom surface of said gate dielectric and a bottom surface;
    a raised drain region having a top surface at a second distance from said bottom surface of said gate dielectric, wherein said first distance is greater than said second distance;

a buried drain region having a topmost surface that is coplanar with a bottom surface of said gate dielectric; and a buried source region having a topmost surface that is coplanar with said bottom surface of said gate dielectric, wherein said raised source region and raised drain region have a same composition throughout, said same composition including a semiconductor material and at least one electrical dopant, and said buried drain region further comprises an upper buried drain region having another composition, said another composition including said at least one electrical dopant and an additional dopant at an additional dopant concentration.

15. The semiconductor structure of claim 14, wherein said additional dopant is a Group IVA element that is different from a semiconductor material of a lower buried drain region located underneath a portion of said upper buried drain region.

16. The semiconductor structure of claim 14, wherein said additional dopant is selected from Group IIIA elements and Group VA elements.

17. The semiconductor structure of claim 14, wherein said additional dopant is a noble gas.

* * * * *